United States Patent
Park et al.

(10) Patent No.: US 9,455,284 B2
(45) Date of Patent: Sep. 27, 2016

(54) STACK TYPE IMAGE SENSOR

(71) Applicant: Samsung Electronics Co., Ltd., Suwon-si (KR)

(72) Inventors: Byung-Jun Park, Yongin-si (KR); Seung-Hun Shin, Suwon-si (KR); Chang-Rok Moon, Seoul (KR); Tae-Seok Oh, Seoul (KR); June-Taeg Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/602,427

(22) Filed: Jan. 22, 2015

(65) Prior Publication Data
US 2015/0311241 A1  Oct. 29, 2015

(30) Foreign Application Priority Data
Jan. 24, 2014  (KR) .................. 10-2014-0009164

(51) Int. Cl.
*H01L 27/146* (2006.01)

(52) U.S. Cl.
CPC ..... *H01L 27/14605* (2013.01); *H01L 27/1462* (2013.01); *H01L 27/1463* (2013.01); *H01L 27/1464* (2013.01); *H01L 27/14612* (2013.01); *H01L 27/14636* (2013.01); *H01L 27/14687* (2013.01)

(58) Field of Classification Search
CPC .................................................. H01L 27/14605
See application file for complete search history.

(56) References Cited

U.S. PATENT DOCUMENTS

| 7,485,968 | B2 | 2/2009 | Enquist et al. | |
|---|---|---|---|---|
| 2011/0102657 | A1 | 5/2011 | Takahashi et al. | |
| 2012/0056288 | A1 | 3/2012 | Yoshihara et al. | |
| 2012/0105696 | A1* | 5/2012 | Maeda | H01L 21/76898 348/302 |
| 2012/0190189 | A1* | 7/2012 | Farooq | H01L 21/0337 438/627 |
| 2012/0267740 | A1 | 10/2012 | Okamoto | |
| 2013/0321680 | A1* | 12/2013 | Kumano | H01L 21/76807 348/273 |
| 2013/0323875 | A1 | 12/2013 | Park et al. | |
| 2014/0124889 | A1* | 5/2014 | Qian | H01L 27/14618 257/448 |

FOREIGN PATENT DOCUMENTS

KR  10-2013-0134162 A  12/2013

* cited by examiner

*Primary Examiner* — Lex Malsawma
(74) *Attorney, Agent, or Firm* — Muir Patent Law, PLLC

(57) ABSTRACT

A stack type image sensor may include: a first chip including a via isolation trench penetrating a first substrate, a via isolation layer including an insulation material in the via isolation trench, a first conductive layer on the first substrate, and a first insulation layer; a second chip including a second conductive layer on a second substrate, and a second insulation layer contacting the first insulation layer; a first via trench penetrating the first substrate to expose the second conductive layer with respect to the trench; and a first through via formed in the first via trench, and including a third conductive layer insulated from the first substrate by the via isolation layer, the third conductive layer electrically connecting the first conductive layer to the second conductive layer. The third conductive layer may be formed in the via isolation trench.

20 Claims, 25 Drawing Sheets

STACK TYPE IMAGE SENSOR

CROSS-REFERENCE TO RELATED APPLICATIONS

This application claims the benefit of priority under 35 U.S.C. §119 to Korean Patent Application No. 10-2014-0009164, filed on Jan. 24, 2014, in the Korean Intellectual Property Office, the disclosure of which is incorporated herein in its entirety by reference.

BACKGROUND

The disclosed embodiments relate to a semiconductor device, and more particularly, to a stack type image sensor.

Image sensors are semiconductor devices that convert an optical image into an electrical signal. An image sensor is typically used in, for example, portable terminals, digital cameras, display devices, etc., and thus is manufactured to be small in size. In order to reduce a size of an image sensor or increase the number of image sensors mounted on one substrate, stack type image sensors in which one substrate is joined to another substrate may be used.

SUMMARY

Aspects of the inventive concept provide a stack type image sensor in which two substrates are joined to each other.

According to an aspect of the inventive concept, there is provided a stack type image sensor including: a first image sensor unit that includes a via isolation trench penetrating from a first surface of a first substrate to a second surface of the first substrate opposite to the first surface, a via isolation layer including an insulation material formed in the via isolation trench, a first landing pad insulated by a first insulation layer formed on the second surface of the first substrate, and a first junction insulation layer disposed on the first landing pad and the first insulation layer; a second image sensor unit that includes a second landing pad, which is insulated by a second insulation layer formed on a second substrate, and a second junction insulation layer which is disposed on the second landing pad and the second insulation layer and contacts the first junction insulation layer; and a through via that is insulated from one or more circuits of the first substrate by the via isolation layer, and electrically connects the first landing pad to the second landing pad. The through via may include a first conductive layer.

The via isolation layer may be formed to pass through from the first surface to the second surface of the first substrate.

The first image sensor unit may include one or more transistors isolated from each other by a first device isolation layer disposed on the second surface of the first substrate. The second image sensor unit may include one or more transistors isolated from each other by a second device isolation layer disposed on a first surface of the second substrate. The via isolation layer may be formed to pass through from the first surface of the first substrate to the first device isolation layer.

The via isolation layer may be formed on the first surface of the first substrate.

The via isolation layer may be formed on an inner wall of the via isolation trench.

A pixel circuit may be provided in the first image sensor unit.

A logic circuit for driving the pixel circuit may be provided in the second image sensor unit.

The through via may be buried in a via trench which passes through the first substrate, the first insulation layer, the first junction insulation layer, and the second junction insulation layer and exposes the first and second landing pads.

The through via may be buried in a first via trench, which passes through the first substrate, the first insulation layer, the first junction insulation layer, and the second junction insulation layer and exposes the second landing pad, and a second via trench which passes through the first substrate and the first insulation layer and exposes the first landing pad.

The through via may be buried in a via trench which passes through the first substrate, the first insulation layer, the first landing pad, the first junction insulation layer, and the second junction insulation layer and exposes the first and second landing pads.

The through via may be formed on an inner wall of a via trench, which passes through the first substrate, the first insulation layer, the first landing pad, the first junction insulation layer, and the second junction insulation layer and exposes the first and second landing pads.

The stack type image sensor may further include a crack propagation stopper layer formed in the first substrate, the first insulation layer, the first junction insulation layer, the second junction insulation layer, the second insulation layer, and the second substrate to prevent crack propagation.

According to another aspect of the inventive concept, there is provided a stack type image sensor including: a first image sensor unit that includes a via isolation layer including an insulation material which passes through from a first surface of a first substrate to a second surface of the first substrate opposite to the first surface, a first insulation layer which is disposed on the first substrate and via isolation layer of the second surface of the first substrate, a first landing pad which is disposed in the first insulation layer, a first junction insulation layer which is disposed on the first landing pad and the first insulation layer, and a pixel circuit; a second image sensor unit that includes a second insulation layer which is disposed on a second substrate, a second landing pad which is disposed in the second insulation layer, a second junction insulation layer which is disposed on the second landing pad and the second insulation layer and contacts the first junction insulation layer, and a logic circuit; a through via that is surrounded by the via isolation layer, and electrically connects the first landing pad to the second landing pad; and an external connection through via that is connected to the first landing pad or the second landing pad. The through via may include a first conductive layer.

The external connection through via may be buried in an external connection via trench which passes through the first substrate, the first insulation layer, the first junction insulation layer, and the second junction insulation layer and exposes an external connection second landing pad having the same level as a level of the second landing pad.

The external connection through via may be buried in an external connection via trench which passes through the first substrate and the first insulation layer and exposes an external connection first landing pad having the same level as a level of the first landing pad.

According to still another aspect of the inventive concept, there is provided a semiconductor device including: a first chip including a via isolation trench penetrating a first substrate, a via isolation layer including an insulation material in the via isolation trench, a first conductive layer on the first substrate, and a first insulation layer; a second chip including a second conductive layer on a second substrate, and a second insulation layer contacting the first insulation layer; a first via trench penetrating the first substrate to expose the second conductive layer with respect to the trench; and a first through via formed in the first via trench, and including a third conductive layer insulated from the first substrate by the via isolation layer, the third conductive layer electrically connecting the first conductive layer to the second conductive layer. The third conductive layer may be formed in the via isolation trench.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
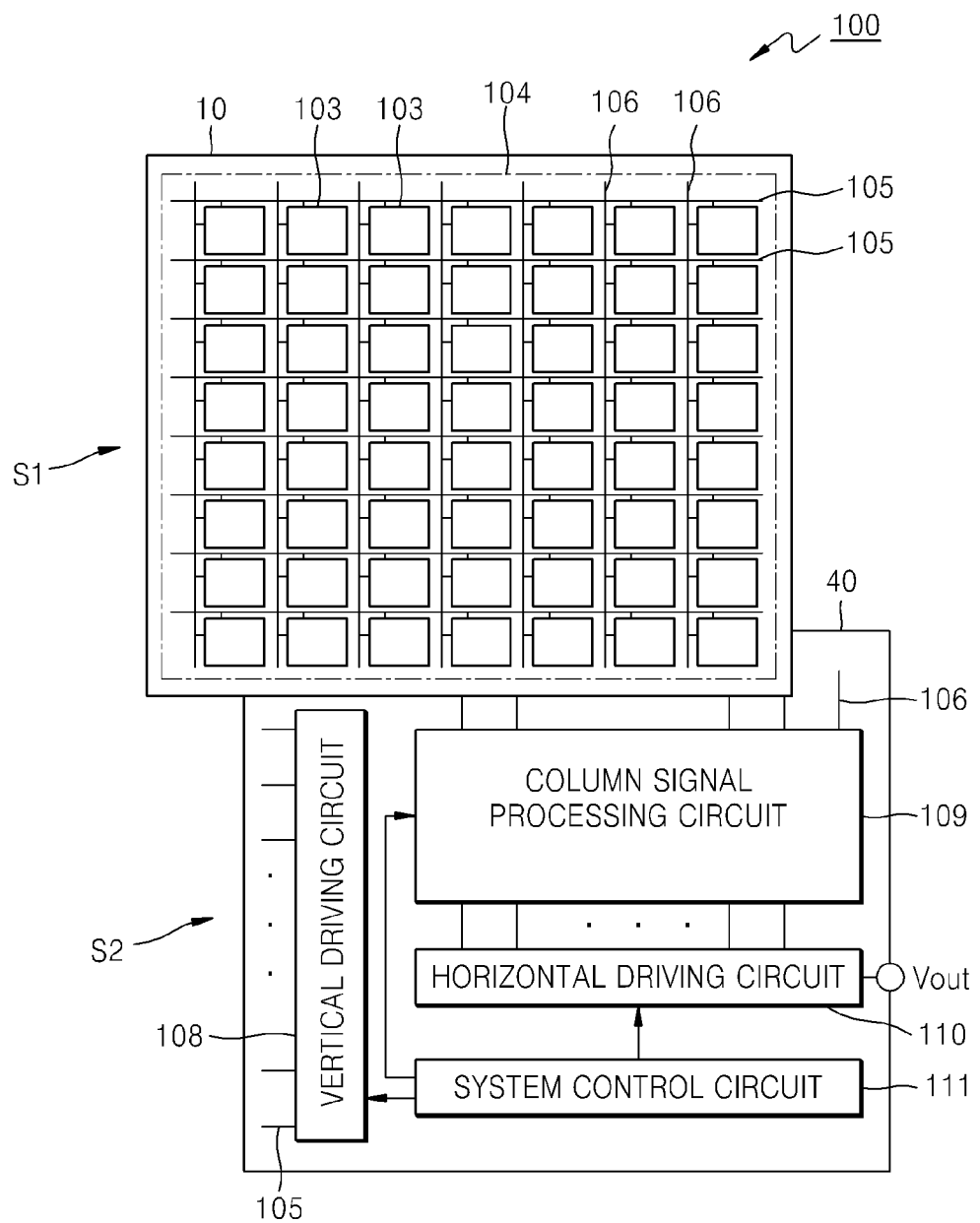
FIG. 1 is a schematic circuit diagram of a stack type image sensor according to example embodiments of the inventive concept.

Various example embodiments will be described in detail with reference to the accompanying drawings. The present disclosure, however, may be embodied in various different forms, and should not be construed as being limited only to the illustrated embodiments. Accordingly, known processes, elements, and techniques are not described with respect to some of the embodiments. Unless otherwise noted, like reference numerals denote like elements throughout the attached drawings and written description, and thus descriptions will not be repeated. In the drawings, the sizes and relative sizes of layers and regions may be exaggerated for clarity.

As used herein, the term "and/or" includes any and all combinations of one or more of the associated listed items. Expressions such as "at least one of," when preceding a list of elements, modify the entire list of elements and do not modify the individual elements of the list.

In the specification, though terms like a first and a second are used to describe various members, components, regions, layers, and/or portions in various embodiments of the inventive concept, the members, components, regions, layers, and/or portions are not limited to these terms. Unless indicated otherwise, these terms do not denote a specific sequence, top and bottom, or merit and demerit, and are used only to differentiate one member, component, region, layer, or portion from another one, for example as a naming convention. Thus, a member, a component, a region, a layer, or a portion referred to as a first member, a first component, a first region, a first layer, or a first portion in an embodiment may be referred to as a second member, a second component, a second region, a second layer, or a second portion in another embodiment. For example, a first element may be referred to as a second element without departing from the spirit and scope of the inventive concept, and similarly, the second element may also be referred to as the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. The term "contact," as used herein, refers to a direct contact, unless indicated otherwise.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a specific embodiment may be differently implemented, a specific process sequence may be performed differently from a described sequence. For example, two processes which are successively described may be substantially performed as described, or may be performed in a sequence opposite to a described sequence.

In the accompanying drawings, for example, modifications of an illustrated shape may be expected according to manufacturing technology and/or a process difference. Thus, embodiments of the inventive concept should not be construed as being limited to a specific shape of a region illustrated in the drawing, and for example, should include a shape change caused in a manufacturing process.

Stack Type Image Sensor Circuit

FIG. 1 is a schematic circuit diagram of a stack type image sensor 100 according to example embodiments of the inventive concept.

In detail, the stack type image sensor 100 includes a first image sensor unit S1 and a second image sensor unit S2. The first image sensor unit S1 may be provided on a first substrate 10, and the second image sensor unit S2 may be provided on a second substrate 40. In one embodiment, each of the first image sensor unit S1 or the second image sensor unit S2 may be a single piece of a semiconductor wafer. For example, each of the first image sensor unit S1 or the second image sensor unit S2 may be formed on a semiconductor chip.

The stack type image sensor 100 may include a configuration in which the first image sensor unit S1 is stacked on and joined to the second image sensor unit S2. A pixel circuit may be provided on the first substrate 10. A logic circuit for driving the pixel circuit may be provided on the second substrate 40.

To provide a detailed description, a pixel region 104 in which a plurality of pixels 103 each including an optical-electrical conversion unit (e.g., a photodiode) are regularly and two-dimensionally arranged is provided at one side (e.g., a first surface) of the first substrate 10. A plurality of driving lines 105 are arranged in a first direction (e.g., row direction) in the pixel region 104. Each of the pixels 103 is disposed to be connected to one pixel driving line 105 and one vertical signal line 106. Each of the pixels 103 may include, for example, the optical-electrical conversion unit, a charge accumulation unit, a plurality of transistors (for example, metal oxide semiconductor (MOS) transistors), and a capacitive unit.

In order to drive the pixels 103 provided on the first substrate 10, a logic circuit including a vertical driving circuit 108, a column signal processing circuit 109, a horizontal driving circuit 110, and a system control circuit 111 is provided at one side (e.g., one surface) of the second substrate 40. Similar to the first substrate 10, a vertical signal line 106 and a pixel driving line 105 are formed on the second substrate 40. An output of the logic circuit is referred to by Vout.

Stack Type Image Sensor Circuit Structure

Figure 2:
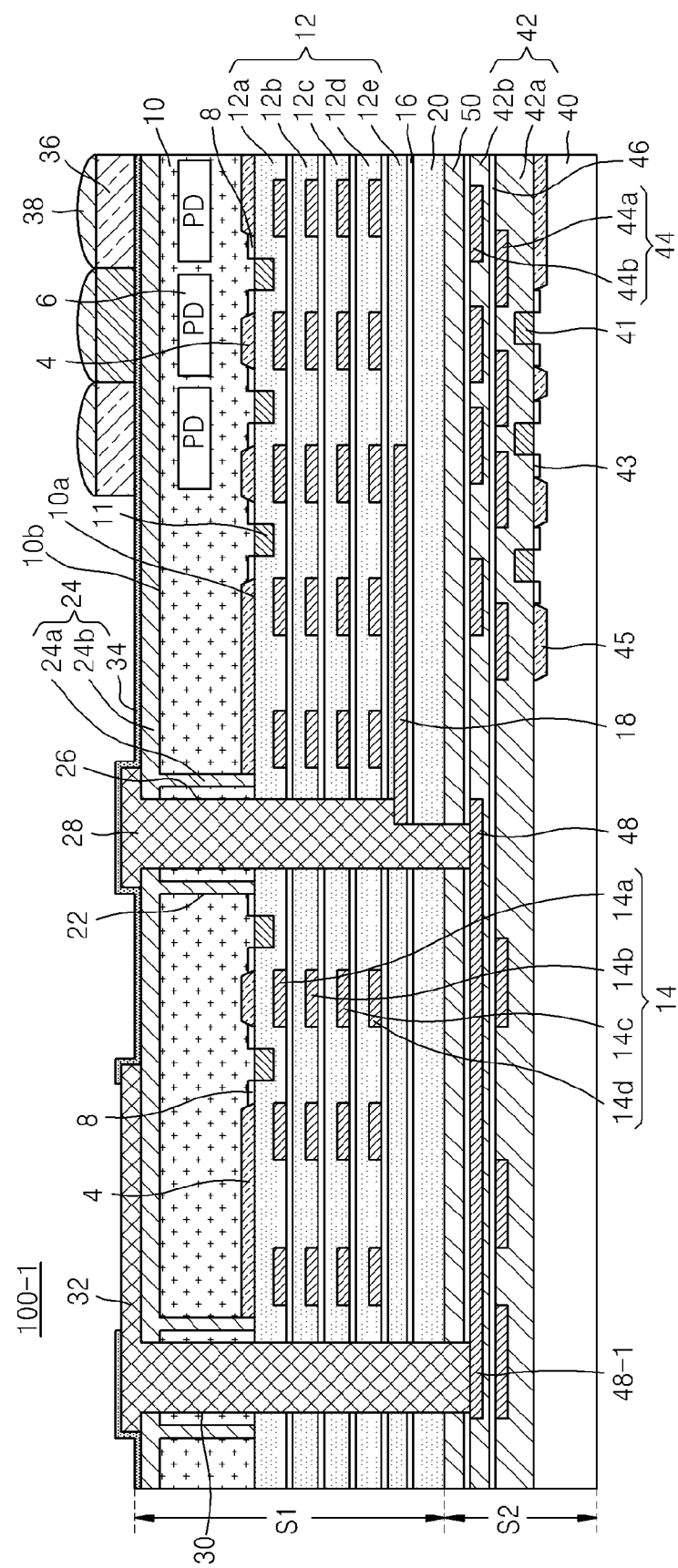
FIG. 2 is a cross-sectional view illustrating a structure of a stack type image sensor according to a first embodiment of the inventive concept.
Figure 3:
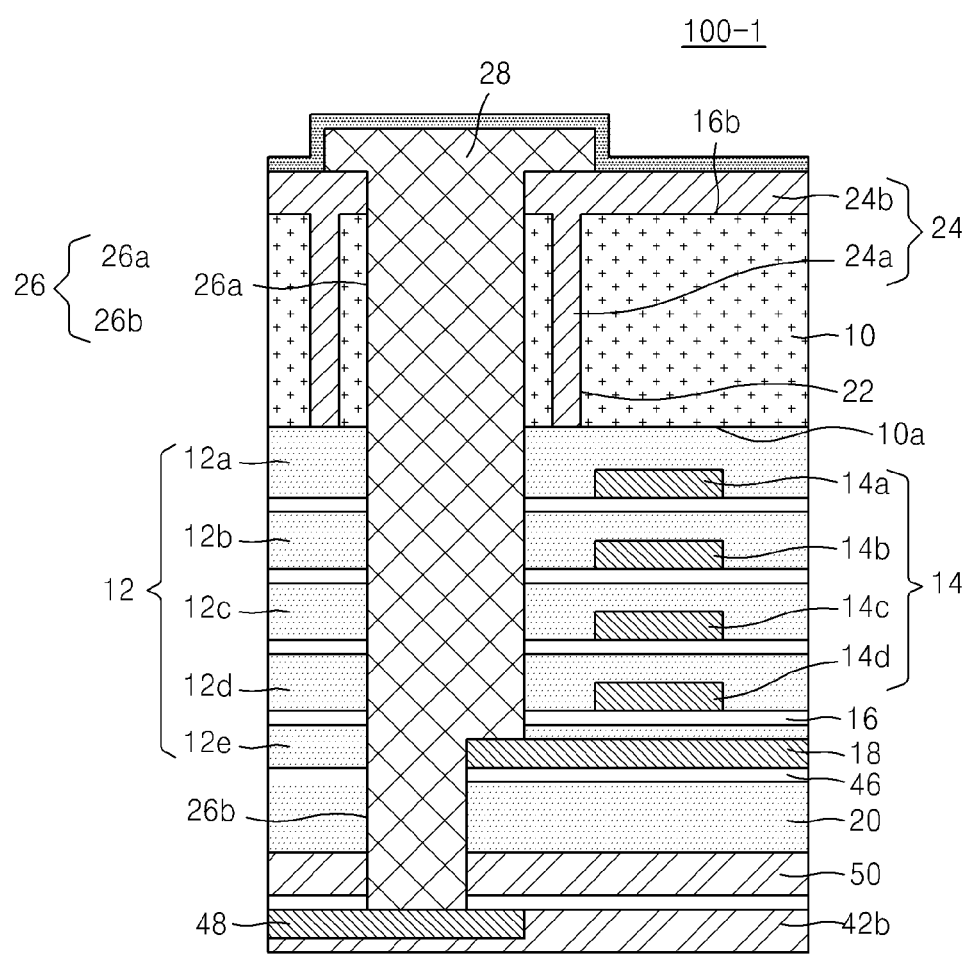
FIG. 3 is an enlarged view for describing a via isolation layer and through via of FIG. 2.

FIG. 2 is a cross-sectional view illustrating a structure of a stack type image sensor 100-1 according to a first embodiment of the inventive concept, FIG. 3 is an enlarged view for describing a via isolation layer and through via of FIG. 2.

In detail, for example, the stack type image sensor 100-1 of FIG. 2 includes a configuration in which a first image sensor unit S1 is joined to a second image sensor unit S2 (e.g., a first wafer piece or chip is joined to a second wafer piece or chip).

The first image sensor unit S1 may be provided on a first substrate 10. The first substrate 10 may be a layer that is formed by thinning a semiconductor substrate such as crystalline silicon. A plurality of elements (for example, an optical-electrical conversion unit 6 (a photodiode), an impurity region 8 which is used as a floating diffusion region or a source/drain of a transistor, a device isolation layer 4, and a gate electrode 11 of the transistor) constituting each of a plurality of pixel circuits are provided at one side of the first substrate 10. In FIG. 2, for convenience, a gate insulation layer contacting the gate electrode 11 is not formed.

A via isolation layer 24 may be disposed on the first substrate 10 in a direction from a first surface 10b to a second surface 10a of the first substrate 10. The via isolation layer 24 may be formed of, for example, an silicon dioxide (SiO2) layer, an silicon nitride (SiN) layer, or an SiOCN layer. The via isolation layer 24 prevents the below described through via 28 from being electrically connected to the first substrate 10. The via isolation layer 24 may be formed so as to be spaced apart from the through via 28 by a certain distance.

The via isolation layer 24 may include a through via isolation layer 24a, which is formed to pass through from the first surface 10b to the second surface 10a of the first substrate 10, and a surface via isolation layer 24b which is formed on the first surface 10b of the first substrate 10. Although described below as including additional portions, in one embodiment, the via isolation layer 24 may include only the through via isolation layer 24a.

By burying a via isolation trench 22 in the first substrate 10, the via isolation layer 24 may be formed on the first surface 10b of the first substrate 10. Although described below, the via isolation trench 22 may be formed by etching the first substrate 10 in a direction from the first surface 10b toward the second surface 10a of the first substrate 10. For example, with a surface of a first insulation layer 12 as an etch stop point, the via isolation layer 24 may be accurately formed from the first surface 10b to the second surface 10a of the first substrate 10.

The first insulation layer 12 is formed on the second surface 10a side of the first substrate 10 and on the via isolation layer 24. The first insulation layer 12 may be formed, for example, of a silicon oxide layer. The first insulation layer 12 may include a plurality of inter-layer insulation layers 12a to 12e.

A first wiring layer 14 may be formed so as to be insulated by the first insulation layer 12. The first wiring layer 14 may be formed, for example, of a metal layer. The first wiring layer 14 may be formed of, for example, copper (Cu) or aluminium (Al). The first wiring layer 14 may include a plurality of assistant wiring layers 14a to 14d. As can be seen, the first wiring layer 14, although described as a layer, may include a plurality of levels of wiring (e.g., each described as an assistant wiring layer or wiring sub-layer). As such, a set of wires at different levels of the first wiring layer 14 may be connected to each other to transmit signals between circuit elements of image sensor 100-1.

A first landing pad 18 is formed so as to be insulated by the first insulation layer 12. The first landing pad 18 is illustrated as being formed in the first insulation layer 12, but may be formed on the first insulation layer 12. The first landing pad 18 may be formed of the same material as that of the first wiring layer 14. As described further below, the first landing pad 18 may be connected to a second landing pad 48 of the second image sensor unit S2.

In one embodiment, a first anti-diffusion layer 16 may be formed on the first wiring layer 14 and the first landing pad 18. The first anti-diffusion layer 16 may prevent metal from being diffused to the first insulation layer 12. The first anti-diffusion layer 16 may be formed of, for example, SiN or silicon carbonitride (SiCN). In certain embodiments, the wiring layers (or wiring sub-layers) described herein and the landing pads described herein may have a similar structure, such as a conductive layer having a particular height and extending horizontally in one or more directions. In general landing pads include at least one exposed portion for connecting to another conductive material, and are used to transfer signals between circuit elements.

A first junction insulation layer 20 may be disposed on the first landing pad 18 and the first insulation layer 12. The first junction insulation layer 20 may be formed of, for example, silicon carbide (SiC) or SiCN. As described further below, the first junction insulation layer 20 may be joined to a second junction insulation layer 50 of the second image sensor unit S2.

A passivation layer 34, a color filter layer 36, and a lens 38 are sequentially stacked on the first side 10b of the first substrate 10. The passivation layer 34 may be formed of, for example, SiO$_2$, SiN, or SiON. The color filter layer 26 and lens 38 may be formed by a plurality of individual color filters and lenses, for example, formed in filter-lens pairs. In one embodiment, the stack type image sensor 100-1 has a bottom-emission structure in which light is incident from one side of the first substrate 10.

The second image sensor unit S2 may be provided on a second substrate 40. The second substrate 40 may be a semiconductor substrate such as crystalline silicon. The second substrate 40 may include a plurality of elements (for example, a gate electrode 41, an impurity region 43, and a device isolation layer 45) included in a logic circuit that drives a pixel circuit. In FIG. 2, for convenience, a gate insulation layer contacting the gate electrode 41 is not shown.

A second insulation layer 42 may be formed on the second substrate 40. The second insulation layer 42 may be formed, for example, of a silicon oxide layer. The second insulation layer 42 may include a plurality of inter-layer insulation layers 42a and 42b. A second wiring layer 44 may be formed in the second insulation layer 42. The second wiring layer 44 may be formed, for example, of a metal layer. The second wiring layer 44 may be formed of, for example, copper (Cu) or aluminium (Al). The second wiring layer 44 may include a plurality of assistant wiring layers 44a and 44b.

A second landing pad 48 is formed so as to be insulated by the second insulation layer 42. The second landing pad 48 is illustrated as being formed in the second insulation layer 42, but may be formed on the second insulation layer 42. The second landing pad 48 may be formed, for example, of the same material as that of the second wiring layer 44. In one embodiment, the second landing pad 48 is connected to the first landing pad 18 of the first image sensor unit S1 by, a conductive through via, for example, the through via 28.

In one embodiment, a second anti-diffusion layer 46 may be formed on the second wiring layer 44 and the second landing pad 48. The second anti-diffusion layer 46 may prevent metal from being diffused to the second insulation layer 42. The second anti-diffusion layer 46 may be formed of, for example, SiN or SiCN.

A second junction insulation layer 50 may be disposed on the second landing pad 48 and the second insulation layer 42. Similar to the first junction insulation layer 20, the second junction insulation layer 50 may be formed of, for example, SiC or SiCN. The second junction insulation layer 50 is joined to a first junction insulation layer 20 of the first image sensor unit S1.

The first image sensor unit S1 is electrically connected to the second image sensor unit S2 by using the through via 28. The through via 28 electrically connects the first landing pad 18 of the first image sensor unit S1 to the second landing pad 48 of the second image sensor unit S2. As such, an image signal converted from light to an electric signal by the first image sensor unit S1 can be passed to the second image sensor unit S2 by using a conductive through via, or a signal of the second image sensor unit S2 may drive a circuit of the first image sensor unit S1 by using a conductive through via. As described above, the through via 28 is insulated from the first substrate 10 of the first image sensor unit S1 by the via isolation layer 24.

The through via 28 may be formed so as to be buried in a via trench 26 (which exposes the first landing pad 18 and the second landing pad 48) through the first substrate 10, the first insulation layer 12, the first junction insulation layer 20, and the second junction insulation layer 50. As described below, the via trench is reliably formed in a direction from the first surface 10b of the first substrate 10 toward the second landing pad 48 of the second substrate 40 (i.e., toward the second substrate 40), and the through via 28 may be formed in the via trench 26.

After the via trench 26 is formed, an anti-reflection layer (not shown) may be further formed on an inner wall of the via trench 26. The via trench 26 may be an internal connection element that connects the first landing pad 18 to the second landing pad 48. The via trench 26 may include a trench 26a (e.g., a first trench portion), having a broad width, and a trench 26b (e.g., a second trench portion) having a narrow width.

An external connection through via 32 connected to the second landing pad 48 may be formed at the first and second image sensor units S1 and S2. The external connection through via 32 may be formed so as to be buried in an external connection via trench 30 (which exposes an external connection second landing pad 48-1 having the same level as that of the second landing pad 48) through the first substrate 10, the first insulation layer 12, the first junction insulation layer 20, and the second junction insulation layer 50. The external connection through via 32 may include a vertical portion and horizontal portion, as shown in FIG. 2. The two portions may be integrally formed. The external connection second landing pad 48-1 may be formed to extend horizontally from the second landing pad 48 for an internal connection.

Similar to the through via 28, the external connection via trench 30 is reliably formed in a direction from the first surface 10b of the first substrate 10 toward the second substrate 40, and the external connection through via 32 is immediately formed in the external connection via trench 30. The passivation layer 34 is not formed at a partial surface of the external connection through via 32, and thus, an external connection terminal (for example, a solder ball) may be formed on the external connection through via 32.

Figure 4:
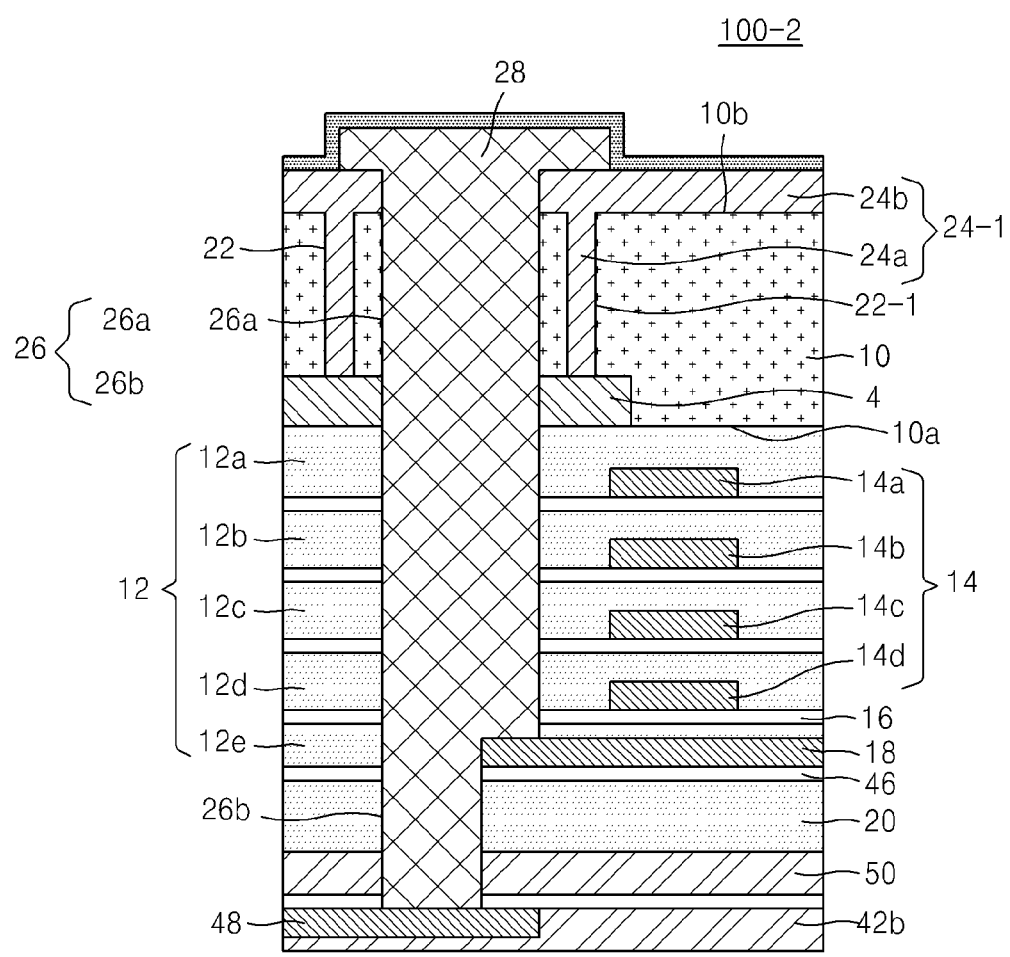
FIG. 4 is a cross-sectional view illustrating a structure of a stack type image sensor according to a second embodiment of the inventive concept.

FIG. 4 is a cross-sectional view illustrating a structure of a stack type image sensor 100-2 according to a second embodiment of the inventive concept.

In detail, the stack type image sensor 100-2 of FIG. 4 is the same as the stack type image sensor 100-1 of FIGS. 2 and 3, except that a via isolation layer 24-1 does not pass through an entirety of a first substrate 10.

A device isolation layer 4 (e.g., an insulation layer) may be formed adjacent to the second surface 10a of the first substrate 10 of the stack type image sensor 100-2 of FIG. 4. The via isolation layer 24-1 may be formed to pass through from the first surface 10b of the first substrate 10 to the device isolation layer 4 adjacent to the second surface 10a of the first substrate 10. The via isolation layer 24-1 may be formed on the first surface 10b of the first substrate 10 by burying a via isolation trench 22-1 which is formed from the inside of the first substrate 10 to the device isolation layer 4.

With the device isolation layer 4 as an etch stop point, the via isolation trench 22-1 may be formed by etching the first substrate 10 in a direction from the first surface 10b toward the second surface 10a of the first substrate 10. The via isolation layer 24-1 may be formed so as to be buried in the via trench 22-1, and thus may be formed up to a surface of the device isolation layer 4. Similar to the via isolation layer 24 of FIGS. 2 and 3, the via isolation layer 24-1 may include a through via isolation layer 24a and a surface via isolation layer 24b.

In comparison with the stack type image sensor 100-1 of FIGS. 2 and 3, the stack type image sensor 100-2 of FIG. 4 insulates the first substrate 10 from a through via 28 by using the via isolation layer 24-1 and the device isolation layer 4, and thus has good insulation performance. Also, unlike the stack type image sensor 100-1 of FIGS. 2 and 3, the via isolation trench 22-1 may be formed so as not to pass through an entirety of the substrate 10, and thus, a manufacturing process of the stack type image sensor 100-2 of FIG. 4 may be made easier.

Figure 5:
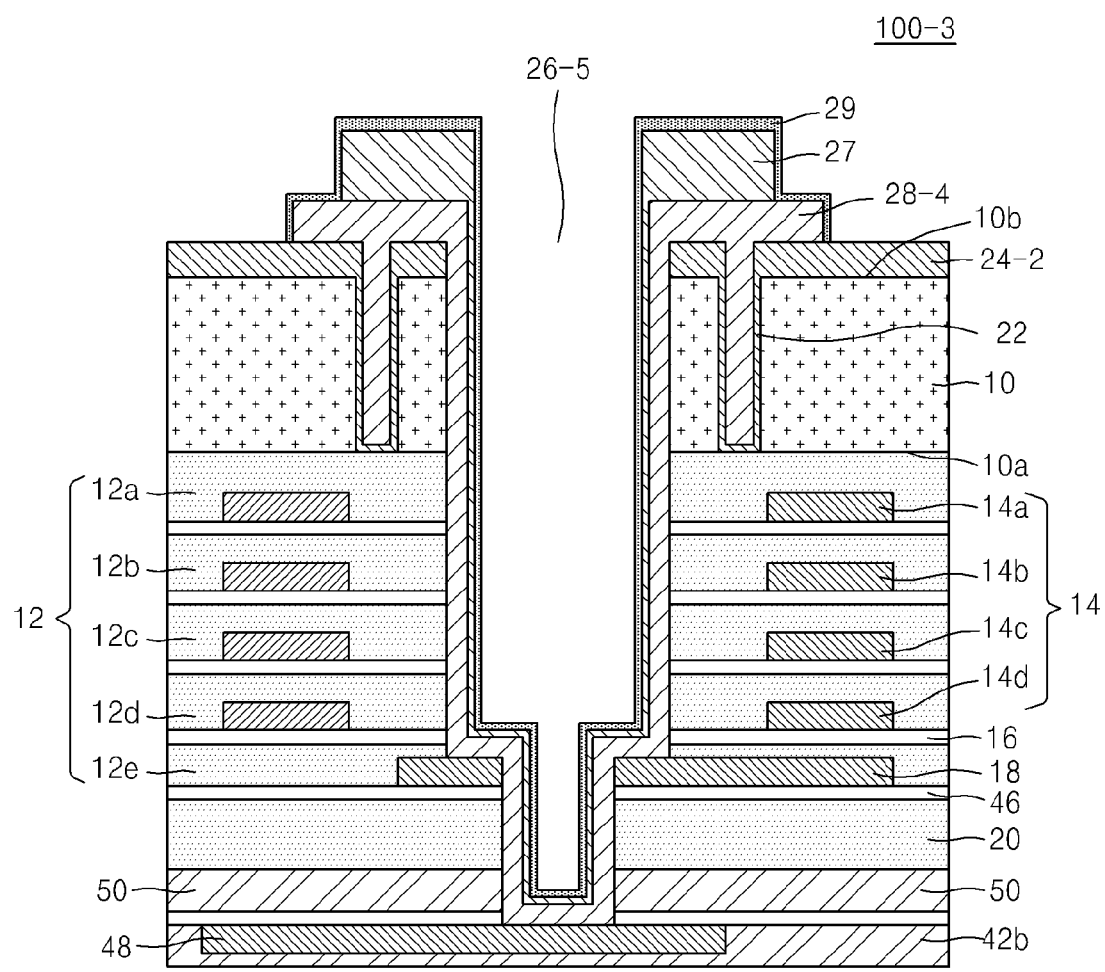
FIGS. 5 and 6 are cross-sectional views respectively illustrating structures of stack type image sensors according to third and fourth embodiments of the inventive concept.
Figure 6:
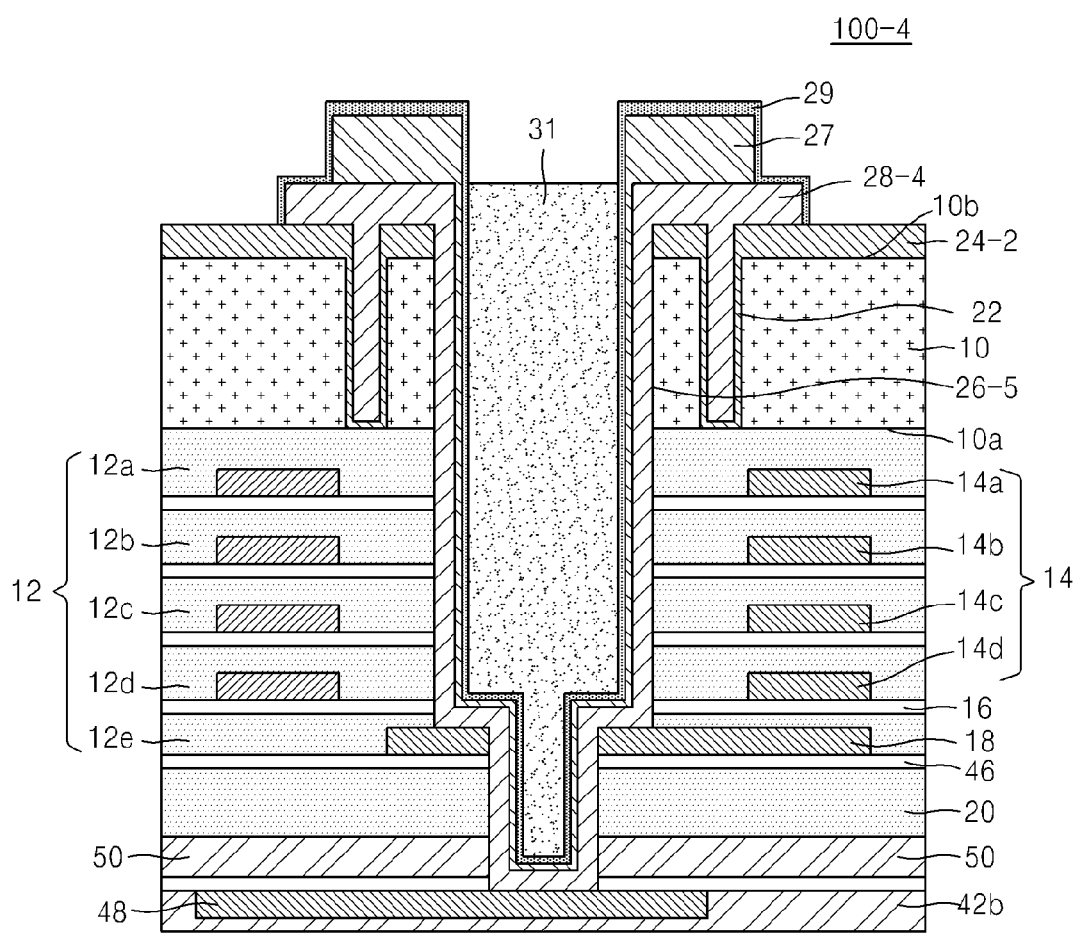

FIGS. 5 and 6 are cross-sectional views respectively illustrating structures of stack type image sensors 100-3 and 100-4 according to third and fourth embodiments of the inventive concept.

In detail, the stack type image sensors 100-3 and 100-4 of FIGS. 5 and 6 are substantially the same as the stack type image sensor 100-1 of FIGS. 2 and 3, except for structures of a via isolation layer 24-2 and a through via 28-4.

In the stack type image sensors 100-3 and 100-4 of FIGS. 5 and 6, the via isolation layer 24-2 is formed on an inner wall of a via isolation trench 22 and on the first surface 10b of the first substrate 10. The via isolation layer 24-2 is formed on an inner wall and bottom of the via isolation trench 22 and on the first surface 10b of the first substrate 10.

In one embodiment, the via isolation layer 24-2 may be formed so as not to completely fill the via isolation trench 22. Since the via isolation layer 24-2 does not completely fill in the via isolation trench 22, a manufacturing process becomes easier. Although the via isolation layer 24-2 is not completely filled in the via isolation trench 22, an insulation characteristic between a through via 28-4 and the first substrate 10 is maintained.

In the stack type image sensors 100-3 and 100-4 of FIGS. 5 and 6, a via trench 26-5 which exposes first and second landing pads 18 and 48 is formed to pass through the first substrate 10, a first insulation layer 12, the first landing pad 18, a first junction insulation layer 20, and a second junction insulation layer 50. In one embodiment, the through via 28-4 is formed on an inner wall of the via trench 26-5 and buried in the via isolation trench 22, simultaneously, and electrically connects the first landing pad 18 to the second landing pad 48.

In the stack type image sensors 100-3 and 100-4 of FIGS. 5 and 6, since the through via 28-4 may be formed on an inner wall of the via trench 26-5 and buried in the via isolation trench 22, simultaneously, a manufacturing process is easy. The through via 28-4 of FIGS. 5 and 6 may be formed of, for example, a tungsten layer which easily buries the via isolation trench 22. In the stack type image sensors 100-3 and 100-4 of FIGS. 5 and 6, since the through via 28-4 does not completely fill the inside of the via trench 26-5, the first landing pad 18 is simply connected to the second landing pad 48.

In one embodiment, in the stack type image sensors 100-3 and 100-4 of FIGS. 5 and 6, the through via 28-4 may be reinforced by additionally forming a metal layer 27 on the through via 28-4. The metal layer 27 may be formed of, for example, an aluminium layer. Thus, the metal layer 27 may act as a through via. A protective layer 29 may be formed on the through via 28-4 or on the metal layer 27, and may protect the through via 28-4 or the metal layer 27 from the outside.

Furthermore, in the stack type image sensor 100-4 of FIG. 6, an anti-moisture-absorption layer 31 may be buried and formed in the via trench 26-5, thereby protecting the through via 28-4, formed in the via trench 26-5, from external moisture. The anti-moisture-absorption layer 31 may be formed of, for example, SiON or SiN.

Figure 7:
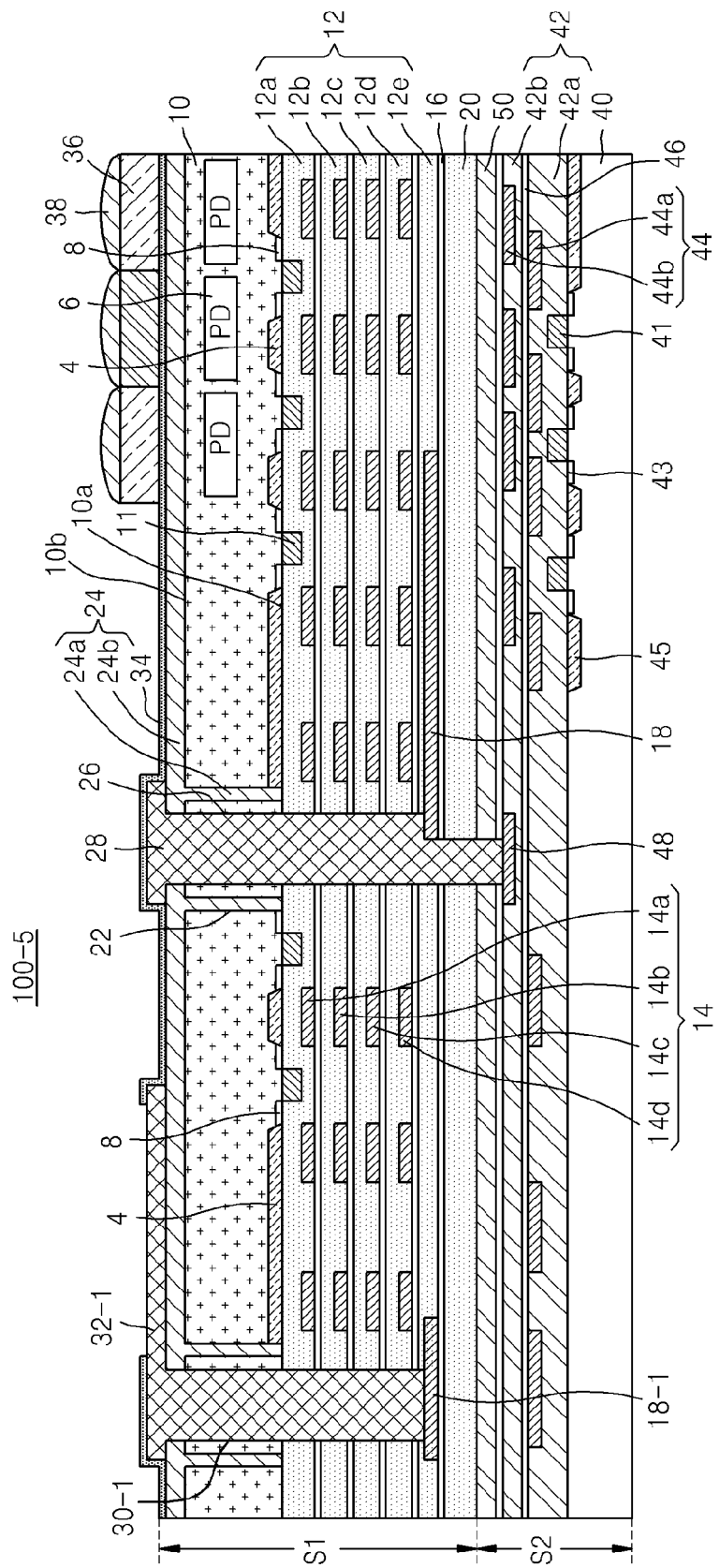
FIG. 7 is a cross-sectional view illustrating a structure of a stack type image sensor according to a fifth embodiment of the inventive concept.

FIG. 7 is a cross-sectional view illustrating a structure of a stack type image sensor 100-5 according to a fifth embodiment of the inventive concept.

In detail, the stack type image sensor 100-5 of FIG. 7 is the same as the stack type image sensor 100-1 of FIGS. 2 and 3, except for an external connection through via 32-1 and certain items to which it connects.

The stack type image sensor 100-5 of FIG. 7 does not include the external connection second landing pad 48-1 which is formed to extend from the second landing pad 48 in FIGS. 2 and 3. For example, the stack type image sensor 100-5 of FIG. 7 includes an external connection first landing pad 18-1 at the same level (e.g., vertical level) as that of the first landing pad 18. The external connection first landing pad 18-1 may be electrically connected to the first landing pad 18.

The external connection through via 32-1 may be buried and formed in an external connection via trench 30-1, which exposes the external connection first landing pad 18-1 having the same level as that of the first landing pad 18, through a first substrate 10 and a first insulation layer 12. The external connection through via 32-1 may not be buried in the second image sensor unit S2, and thus is more reliably formed, thereby facilitating a manufacturing process.

Figure 8:
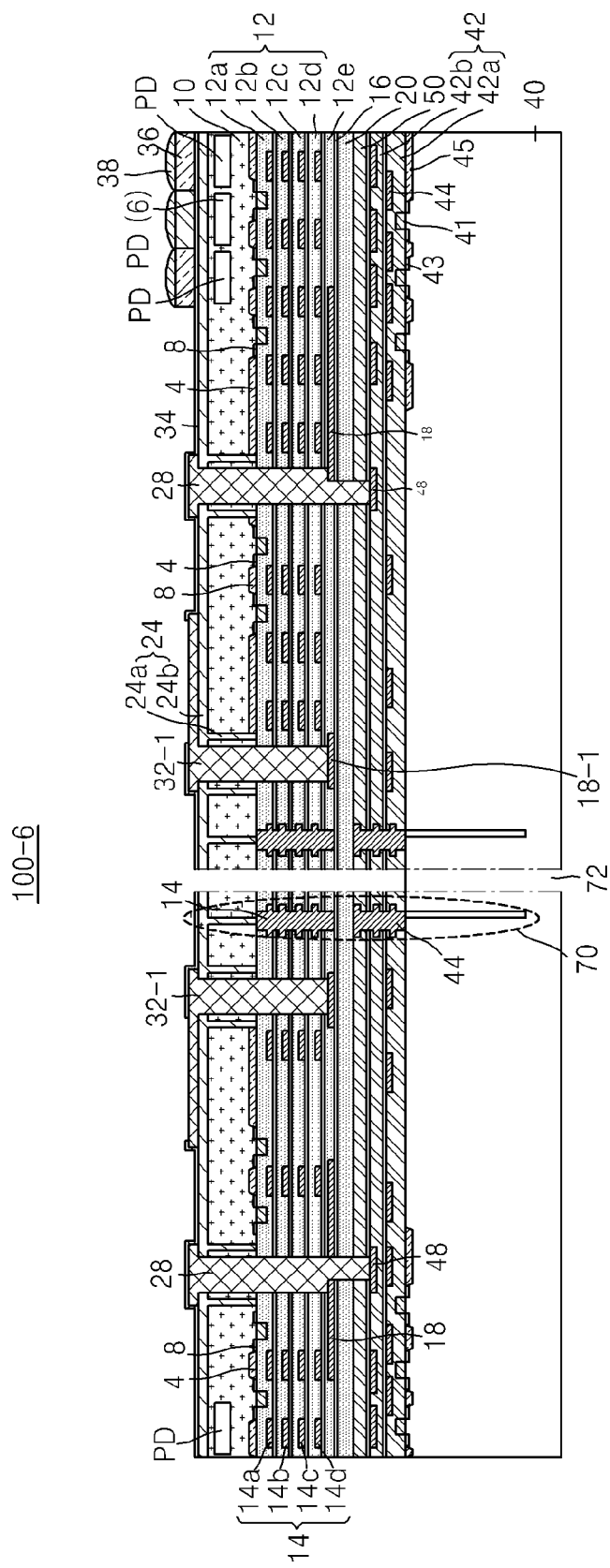
FIGS. 8 and 9 are cross-sectional views respectively illustrating structures of stack type image sensors according to sixth and seventh embodiments of the inventive concept.
Figure 9:
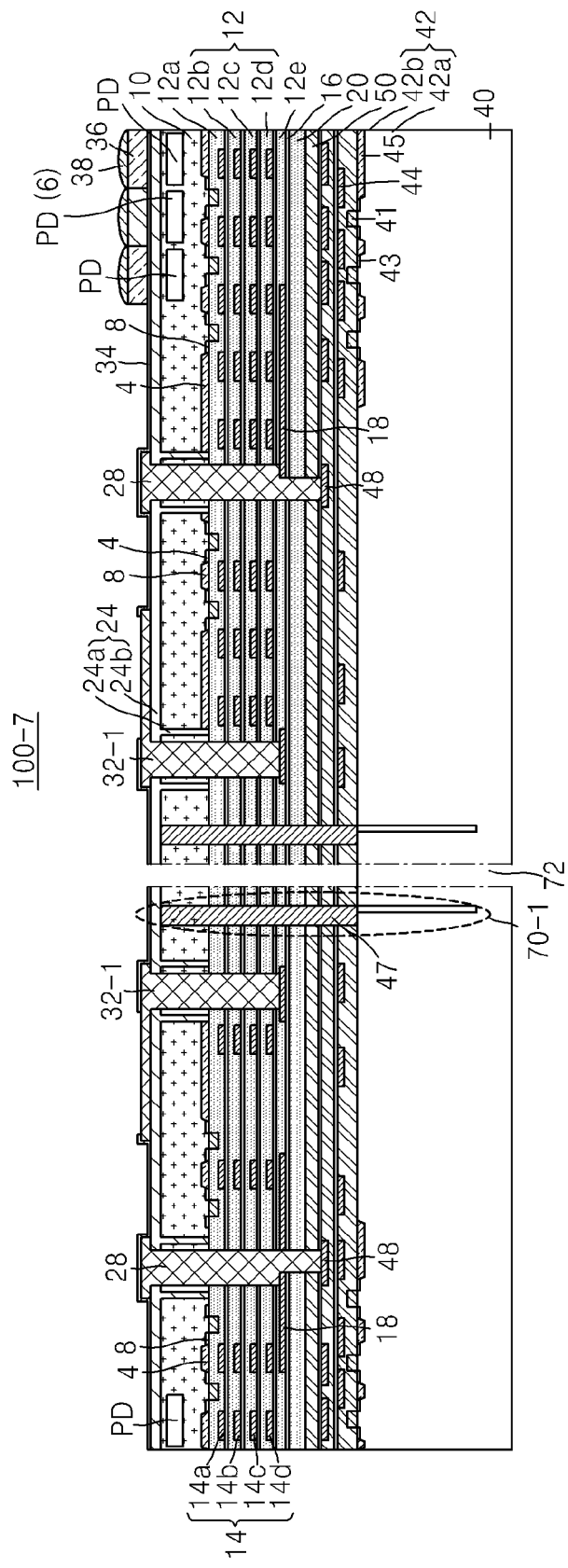

FIGS. 8 and 9 are cross-sectional views respectively illustrating structures of stack type image sensors 100-6 and 100-7 according to sixth and seventh embodiments of the inventive concept.

In detail, the stack type image sensors 100-6 and 100-7 of FIGS. 8 and 9 are the same as the stack type image sensor 100-5 of FIG. 7, except that a plurality of crack propagation stopper layers 70 and 70-1 are formed.

In the stack type image sensors 100-6 and 100-7 of FIGS. 8 and 9, the crack propagation stopper layers 70 and 70-1 are formed at one side of an external connection through via 32-1. The crack propagation stopper layers 70 and 70-1 prevent a crack from being propagated when chips provided on a semiconductor wafer (a substrate) are cut along a cutting line 72 so as to manufacture each of the chips.

For example, a crack is propagated to the inside of chips during a process of cutting a semiconductor wafer. To prevent such crack propagation, the stack type image sensor 100-6 of FIG. 8 includes a first substrate 10, a first insulation layer 12, and a second insulation layer 42, which are adjacent to one side of the external connection through via 32-1 and the cutting line 72, and the crack propagation stopper layer 70 which is formed in a second substrate 40 and prevents crack propagation. In FIG. 8, a portion of a via isolation layer 24 and a portion of each of first and second wiring layers 14 and 44 may be included in the crack propagation stopper layer 70.

In one embodiment, to further prevent crack propagation, the crack propagation stopper layer 70-1 which prevents crack propagation is formed in a first substrate 10, a first insulation layer 12, a first junction insulation layer 20, a second junction insulation layer 50, a second insulation layer 42, and a second substrate 40 of the stack type image sensor 100-7 of FIG. 9. In comparison with FIG. 8, the crack propagation stopper layer 70-1 may be formed in the first junction insulation layer 20. In comparison with FIG. 8, the crack propagation stopper layer 70-1 may include a wiring layer 47 (e.g., the crack propagation stopper layer may be in the form of a vertically formed conductive material), and may be formed in the same process in which the through via 28 is formed, thereby simplifying a manufacturing process.

Method of Manufacturing Stack Type Image Sensor

Figure 10:
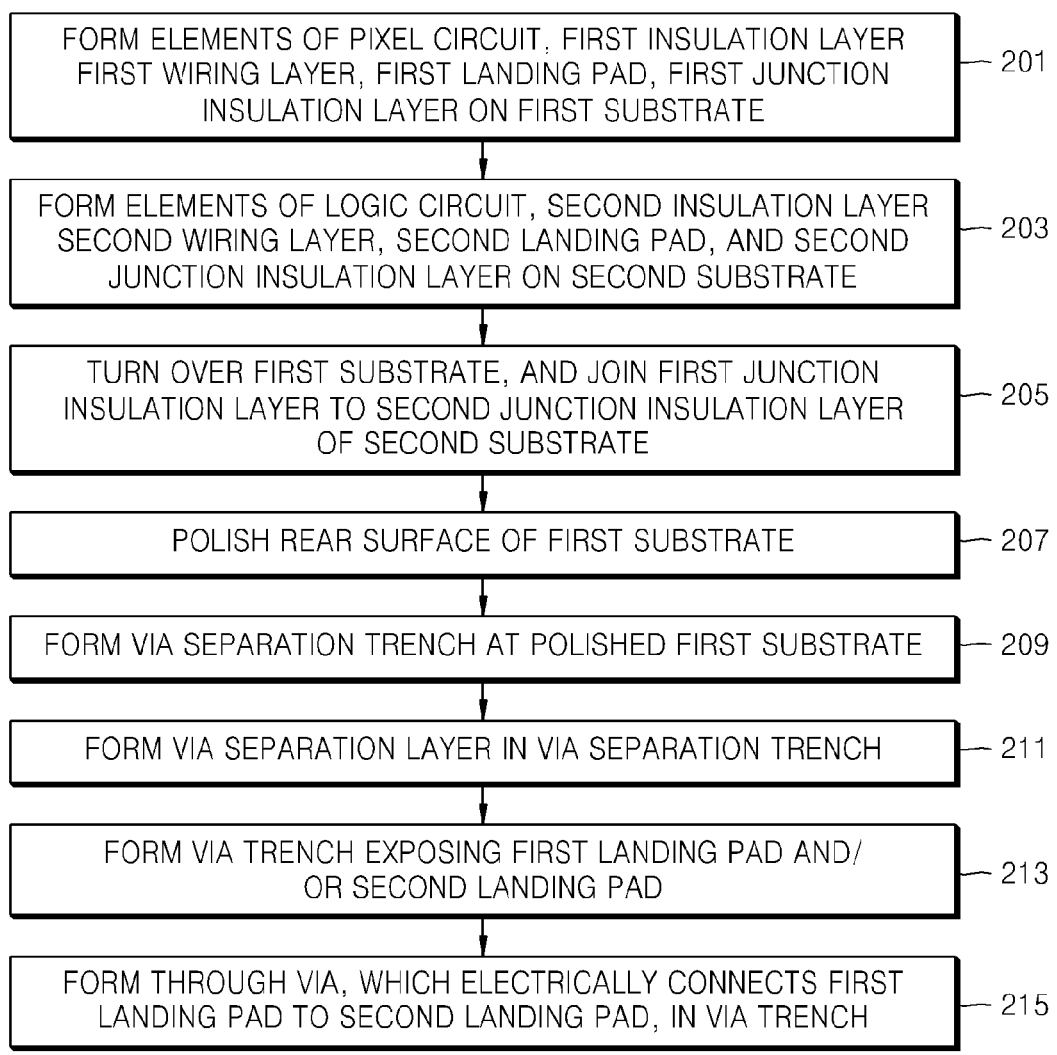
FIG. 10 is a flowchart for describing a method of manufacturing a stack type image sensor according to an exemplary embodiment of the inventive concept.
Figure 19:
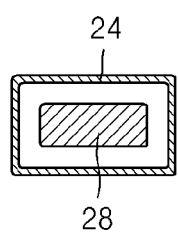
FIGS. 19 and 20 are plan views illustrating a via isolation layer and a through via of FIGS. 11 to 18, according to one exemplary embodiment.
Figure 20:
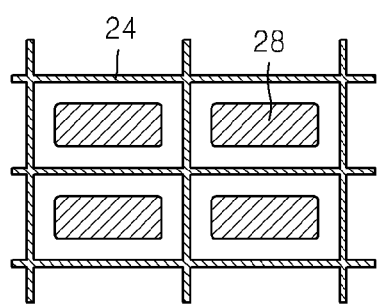

FIG. 10 is a flowchart for describing a method of manufacturing a stack type image sensor according to an exemplary embodiment of the inventive concept, and FIGS. 11 to 18 are cross-sectional views for describing a method of manufacturing a stack type image sensor according to exemplary embodiments of the inventive concept. FIGS. 19 and 20 are plan views illustrating a via isolation layer and a through via of FIGS. 11 to 18, according to one exemplary embodiment.

Figure 11:
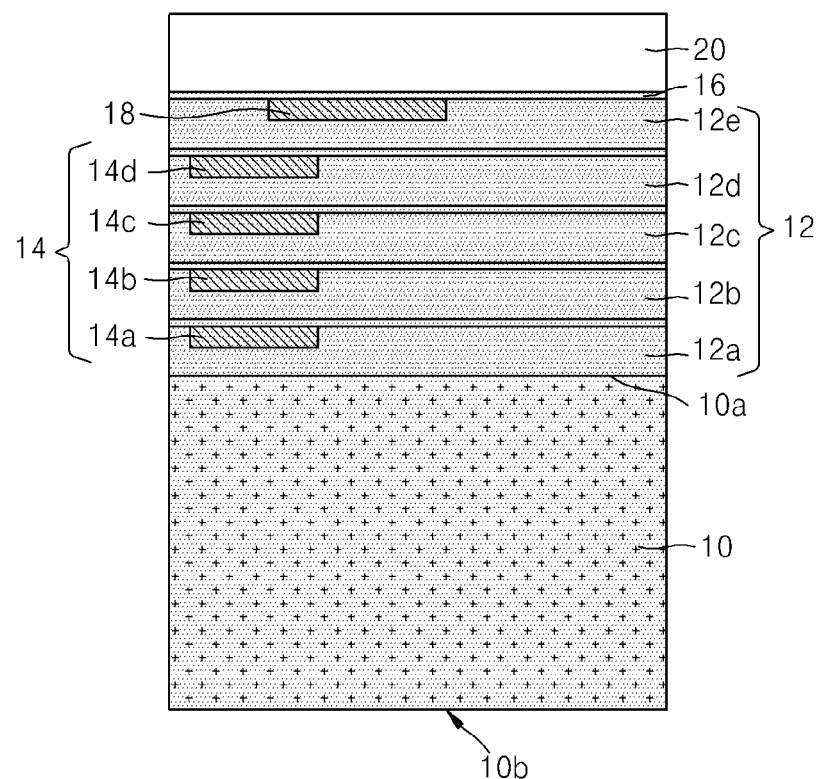
FIGS. 11 to 16, 17A to 17C, and 18A to 18C are cross-sectional views for describing a method of manufacturing a stack type image sensor according to exemplary embodiments of the inventive concept.

In detail, as illustrated in FIGS. 10 and 11, elements (not shown) of a pixel circuit, the first insulation layer 12, the first wiring layer 14, the first landing pad 18, and the first junction insulation layer 20 are formed on the first substrate 10 in step 201.

The first substrate 10 may include a surface 10a and a rear surface 10b. In a subsequent process, the first substrate 10 may be turned over, and thus, the surface 10a and the rear surface 10b may be respectively switched. As such, one of these surfaces may be referred to as a first surface, and the other as a second surface, or vice versa. As described above with reference to FIGS. 1 and 2, the elements (not shown) of the pixel circuit may be provided on the first substrate 10.

The first insulation layer 12 may include the plurality of inter-layer insulation layers 12a to 12e. The first wiring layer 14 may include the plurality of assistant wiring layers, or sub-wiring layers 14a to 14d. The first landing pad 18 may be formed so as to be insulated by the first insulation layer 12. The first landing pad 18 is illustrated as being formed in the first insulation layer 12, but may be formed on the first insulation layer 12.

The first anti-diffusion layer 16 may be formed on the first wiring layer 14 and the first landing pad 18. The first anti-diffusion layer 16 may prevent metal from being diffused to the first insulation layer 12. The first anti-diffusion layer 16 may be formed of, for example, SiN or SiCN.

Figure 12:
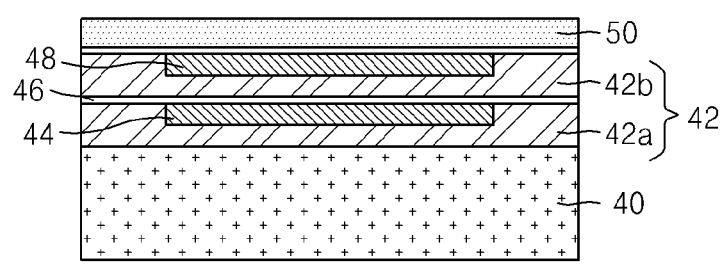

As illustrated in FIGS. 10 and 12, elements (not shown) of a logic circuit, the second insulation layer 42, the second wiring layer 44, the second landing pad 48, and the second junction insulation layer 50 are formed on the second substrate 40 in step 203. The elements (not shown) of the logic circuit for driving the pixel circuit described above with reference to FIGS. 1 and 2 may be provided on the second substrate 40.

The second insulation layer 42 may include the plurality of inter-layer insulation layers 42a and 42b. The second wiring layer 44 may be formed in the second insulation layer 42. The second wiring layer 44 may be formed of a metal layer, for example, copper (Cu) or aluminium (Al). The second wiring layer 44 may include the plurality of assistant wiring layers 44a and 44b as shown in FIG. 2.

The second landing pad 48 is formed so as to be insulated by the second insulation layer 42. The second landing pad 48 is illustrated as being formed in the second insulation layer 42, but may be formed on the second insulation layer 42. The second landing pad 48 may be formed of the same material as that of the second wiring layer 44. The second landing pad 48 may be electrically connected to the first landing pad 18.

The second anti-diffusion layer 46 may be formed on the second wiring layer 44 and the second landing pad 48. The second anti-diffusion layer 46 may prevent metal from being diffused to the second insulation layer 42. The second anti-diffusion layer 46 may be formed of, for example, SiN or SiCN. The second junction insulation layer 50 is formed on the second landing pad 48 and the second insulation layer 42. The second junction insulation layer 50 is joined to the first junction insulation layer 20 in a subsequent process.

Figure 13:
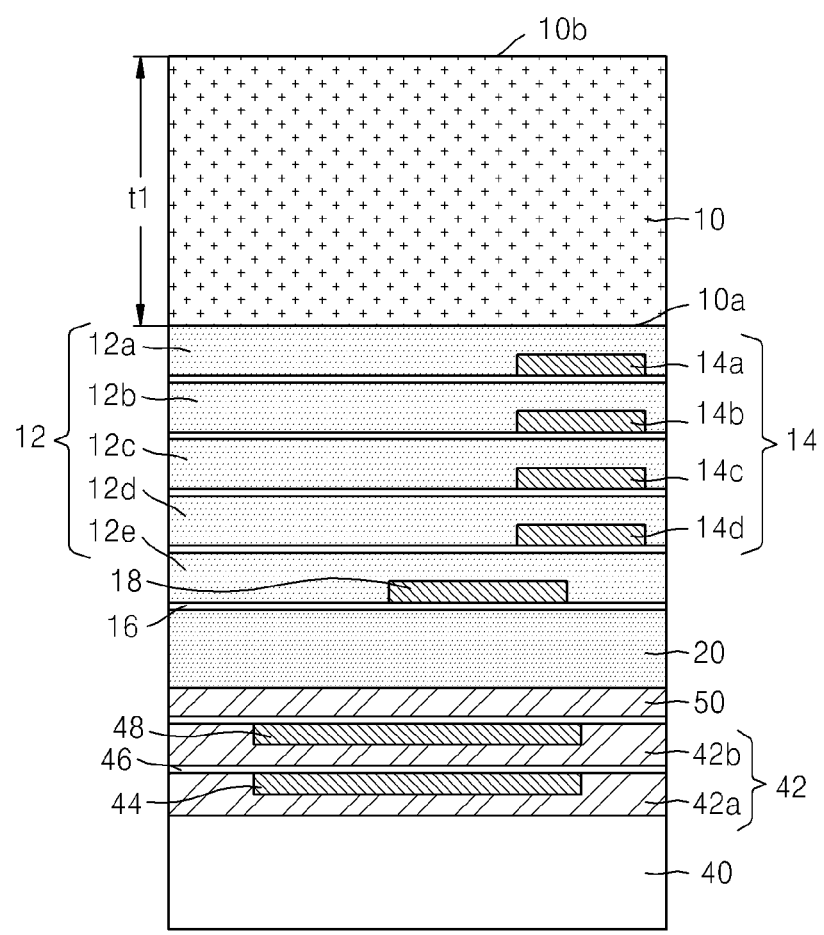

As illustrated in FIGS. 10 and 13, by turning over the first substrate 10, the first junction insulation layer 20 is stacked on and joined to the second junction insulation layer 50 of the second substrate 40 in step 205. As a result, the first junction insulation layer 20 is joined to the second junction insulation layer 50. A thickness of the first substrate 10 is referred to by t1.

An example of a process of joining the first junction insulation layer 20 to the second junction insulation layer 50 will be described below.

An exemplary joining process performs oxygen plasma processing and using water to clean surfaces of the first junction insulation layer 20 and the second junction insulation layer 50. Then, a hydroxyl group is applied to the surfaces of the first junction insulation layer 20 and the second junction insulation layer 50, and the first junction insulation layer 20 is adhered to the second junction insulation layer 50.

Subsequently, by performing thermal treatment of the first junction insulation layer 20 and the second junction insulation layer 50, the first junction insulation layer 20 is joined to the second junction insulation layer 50 by a dehydration condensation reaction of the hydroxyl group applied to the surfaces of the first junction insulation layer 20 and the second junction insulation layer 50.

Figure 14:
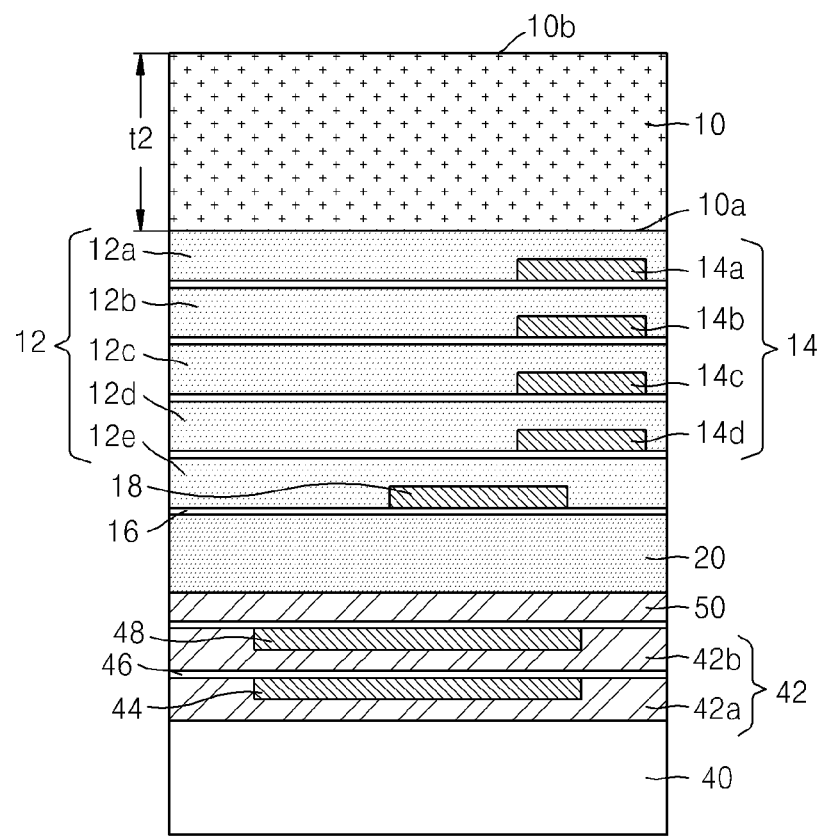

As illustrated in FIGS. 10 and 14, the rear surface 10b of the first substrate 10 is polished in step 207. In polishing the rear surface 10b of the first substrate 10, the thickness of the first substrate 10 is reduced from t1 to t2. When the first substrate 10 is turned over and polished, the rear surface 10b of the polished first substrate 10 may be referred to as a first surface 10b of the first substrate 10, and the surface 10a of the first substrate 10 may be referred to as a second surface 10a which is opposite to the first surface 10b.

Figure 15:
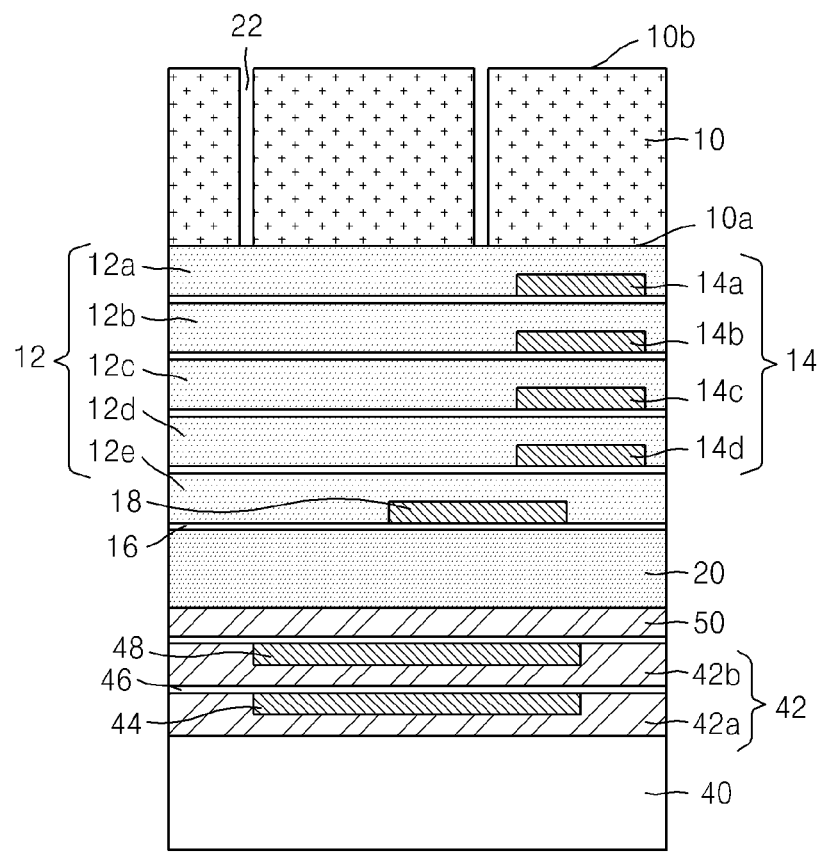

As illustrated in FIGS. 10 and 15, the via isolation trench 22 is formed on the polished first substrate 10 in step 209. The via isolation trench 22 may be formed by etching the first substrate 10 in a direction from the first surface 10b toward the second surface 10a of the first substrate 10. Since the via isolation trench 22 is formed by etching the first substrate 10 in the direction from the first surface 10b to the second surface 10a of the first substrate 10 with the surface of the first insulation layer 12 (e.g., 12a) as the etch stop point, the second surface 10a of the first substrate 10 and the surface of the first insulation layer 12 may also be formed accurately.

Figure 16:
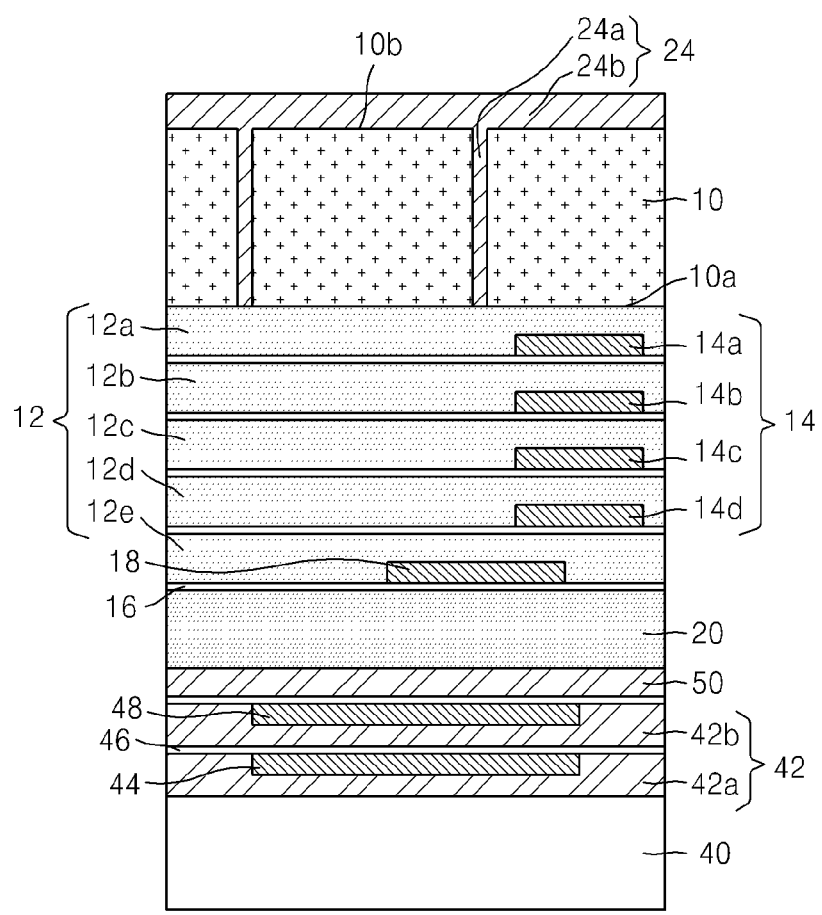

As illustrated in FIGS. 10 and 16, the via isolation layer 24 is formed in the via isolation trench 22 in step 211. The via isolation layer 24 may be formed on the first surface 10b of the first substrate 10 and burying the via isolation trench 22. An insulating material may be formed on the first surface 10b of the first substrate 10 and fill the via isolation trench 22, and then, the via isolation layer 24 may be formed through planarization etching. The planarization etching may use a chemical mechanical polishing process.

Therefore, the via isolation layer 24 may include the through via isolation layer 24a, which is formed to pass through from the first surface 10b to the second surface 10a of the first substrate 10, and the surface via isolation layer 24b which is formed on the first surface 10b of the first substrate 10. Depending on the case, the via isolation layer 24 may include only the through via isolation layer 24a.

Figure 17A:
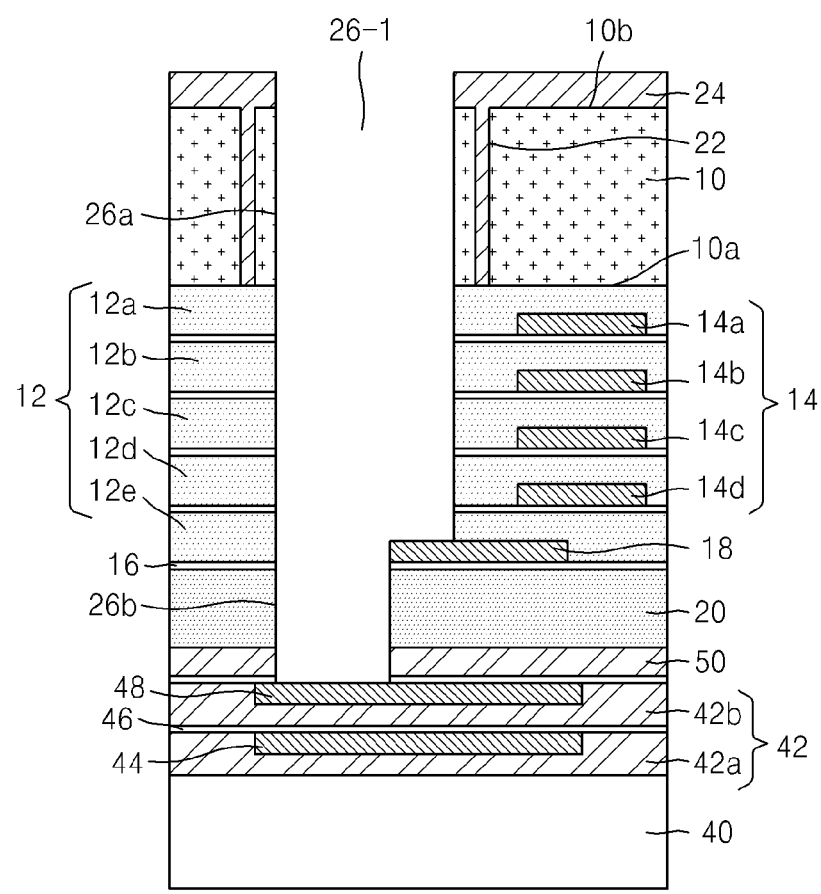
Figure 17B:
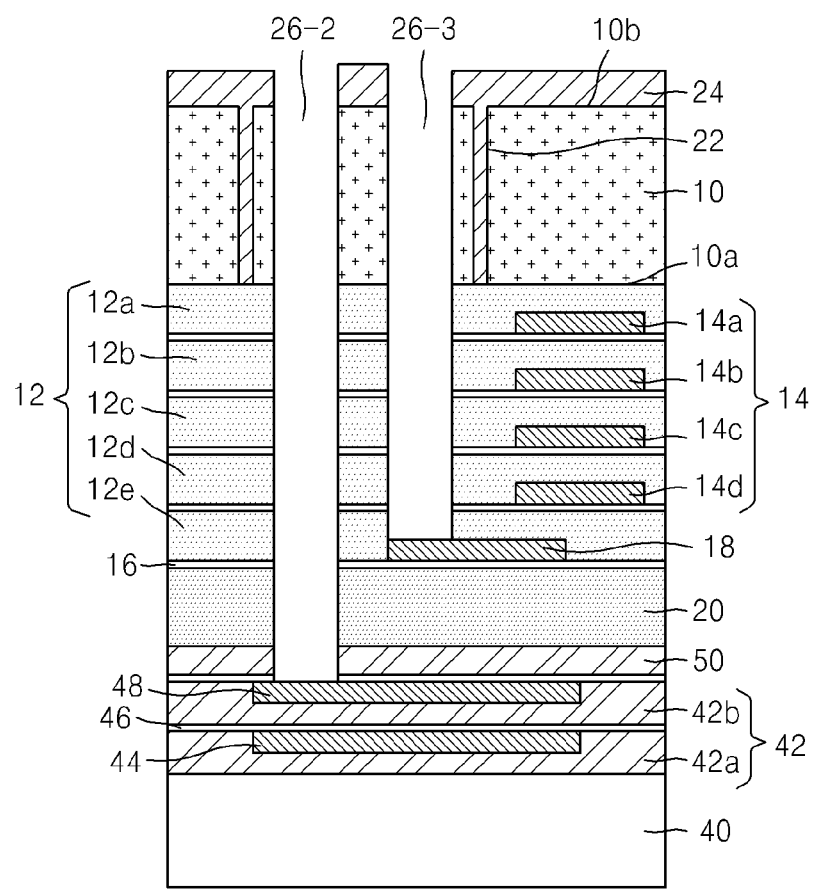
Figure 17C:
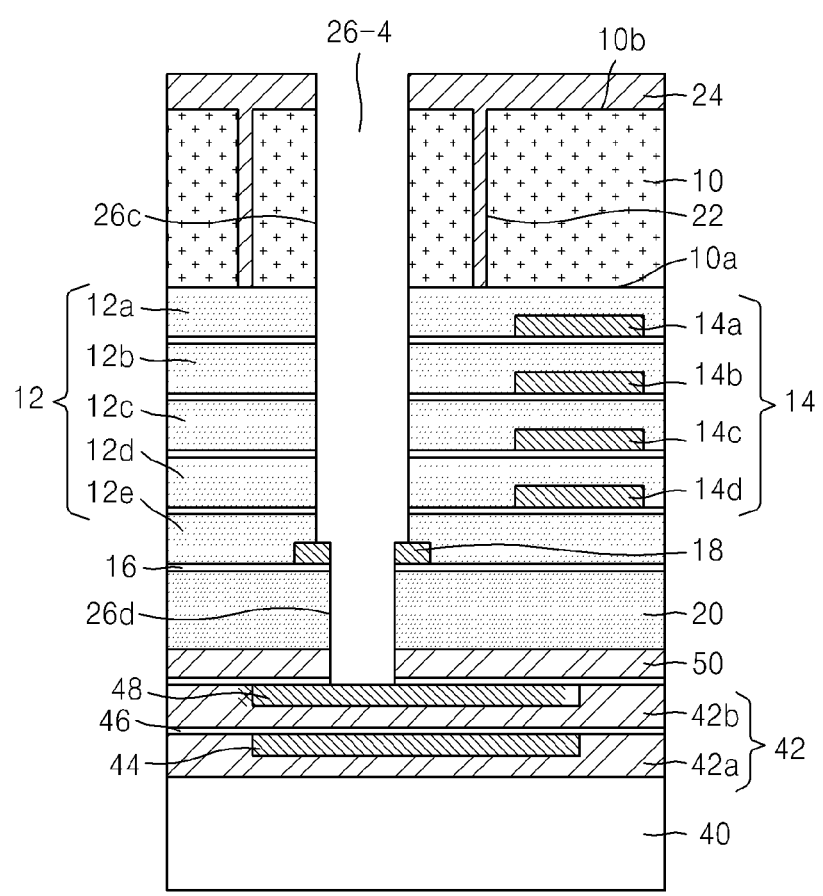

As illustrated in FIGS. 10 and 17A to 17C, a plurality of via trenches 26-1 to 26-4 which expose the first landing pad 18 and/or the second landing pad 48 are formed in step 213. The plurality of via trenches 26-1 to 26-4, as illustrated in FIGS. 17A to 17C, may be variously formed. The via trenches 26-1 to 26-4 are reliably formed by being etched in a direction from the first surface 10b of the first substrate 10 toward the second landing pad 48 of the second substrate 40 (i.e., toward the second substrate 40).

As illustrated in FIG. 17A, the via trench 26-1 may be formed to pass through the first substrate 10, the first insulation layer 12, the first junction insulation layer 20, and the second junction insulation layer 50 and expose the first and second landing pads 18 and 48. The via trench 26-1 may include a trench 26a, having a broad width, and a trench 26b which has a narrow width and is disposed under the trench 26a.

As illustrated in FIG. 17B, in the first and second via trenches 26-2 and 26-3, the first via trench 26-2 may be formed to pass through the first substrate 10, the first insulation layer 12, the first junction insulation layer 20, and the second junction insulation layer 50 and expose the second landing pad 48, and the second via trench 26-3 may be formed to pass through the first substrate 10 and the first insulation layer 12 and expose the first landing pad 18. An upper width of the first via trench 26-2 may be the same as a lower width of the first via trench 26-2. Also, an upper width of the second via trench 26-3 may be the same as a lower width of the second via trench 26-3.

As illustrated in FIG. 17C, the via trench 26-4 may be formed to pass through the first substrate 10, the first insulation layer 12, the first landing pad 18, the first junction insulation layer 20, and the second junction insulation layer 50 and expose the first and second landing pads 18 and 48. The via trench 26-4 may be formed to pass through a central portion of the first landing pad 18. The via trench 26-4 may include a first trench portion 26c, having a broad width, and a second trench portion 26d which has a narrow width and is disposed under the first trench portion 26c.

Figure 18A:
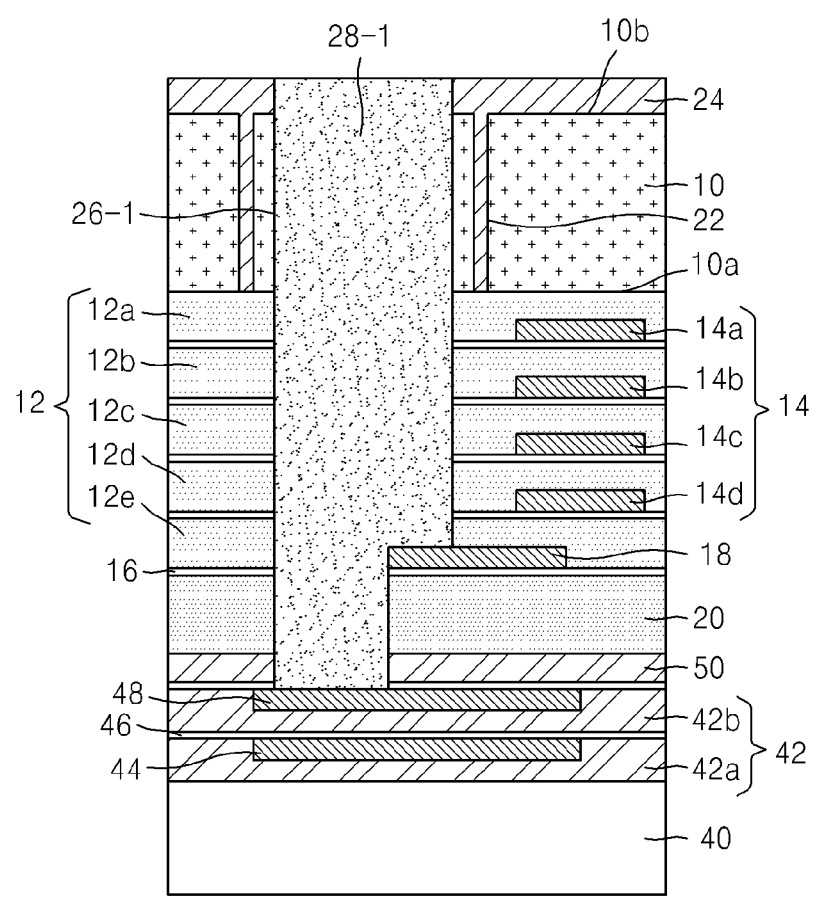
Figure 18B:
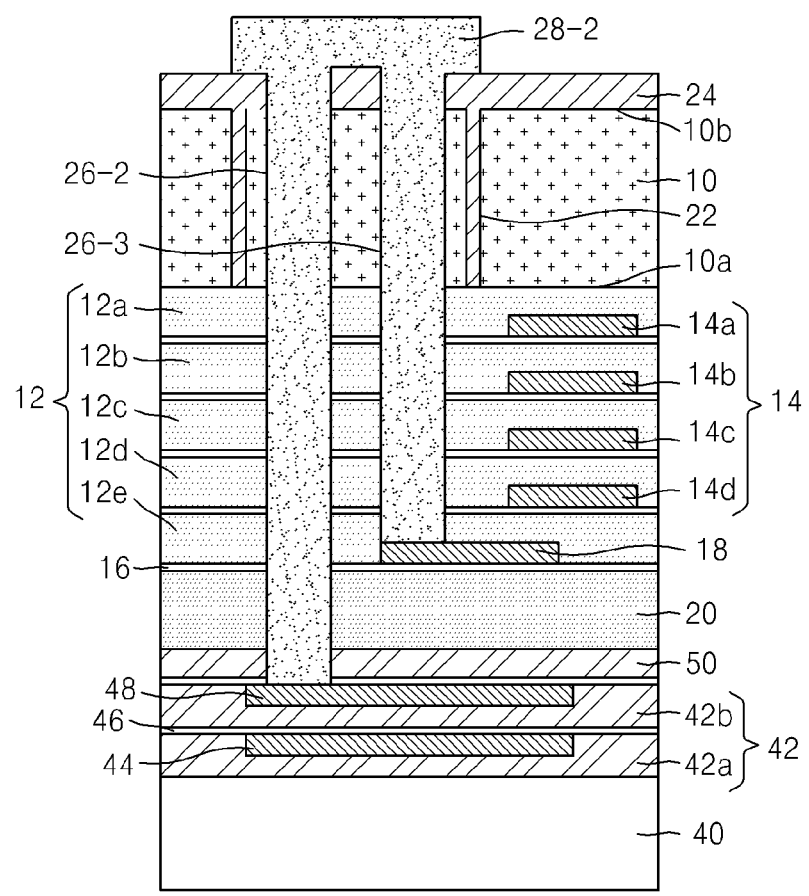
Figure 18C:
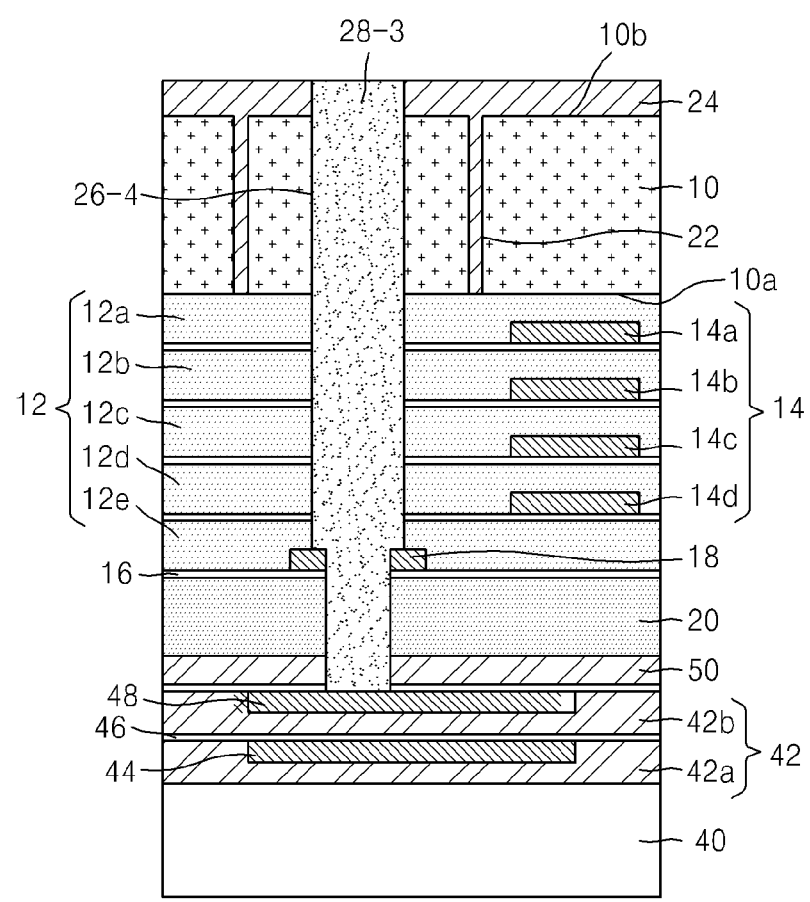

As illustrated in FIGS. 10 and 18A to 18C, a plurality of through vias 28-1 to 28-3 which electrically connect the first and second landing pads 18 and 48 are formed in the via trenches 26-1 to 26-4 in step 215. The plurality of through vias 28-1 to 28-3, as illustrated in FIGS. 18A to 18C, may be variously formed.

As illustrated in FIG. 18A, the through via 28-1 may be buried and formed in the via trench 26-1. As illustrated in FIG. 18B, the through via 28-2 may be buried in the via trenches 26-2 and 26-3, and formed on the via isolation layer 24. As illustrated in FIG. 18C, the through via 28-3 may be buried and formed in the via trench 26-4. The through vias may be formed, for example, of an electrically conductive material, such as a metal. As such, the through vias may be referred to as conductive through vias.

An exemplary plane arrangement between the via isolation layer 24 and the through via 28 will be described with reference to FIGS. 19 and 20.

As described above, the via isolation layer 24 may be formed on the first substrate 10. The through via 28 may be formed in the via isolation layer 24 to be spaced apart from the via isolation layer 24 by a certain distance. In one embodiment, the via isolation layer 24 may be formed to surround the through via 28. As illustrated in FIG. 19, the via isolation layer 24 may be formed so as to be distinguished for each through via 28. As illustrated in FIG. 20, a plurality of the via isolation layers 24 may be connected without being distinguished for each through via 28.

Figure 21:
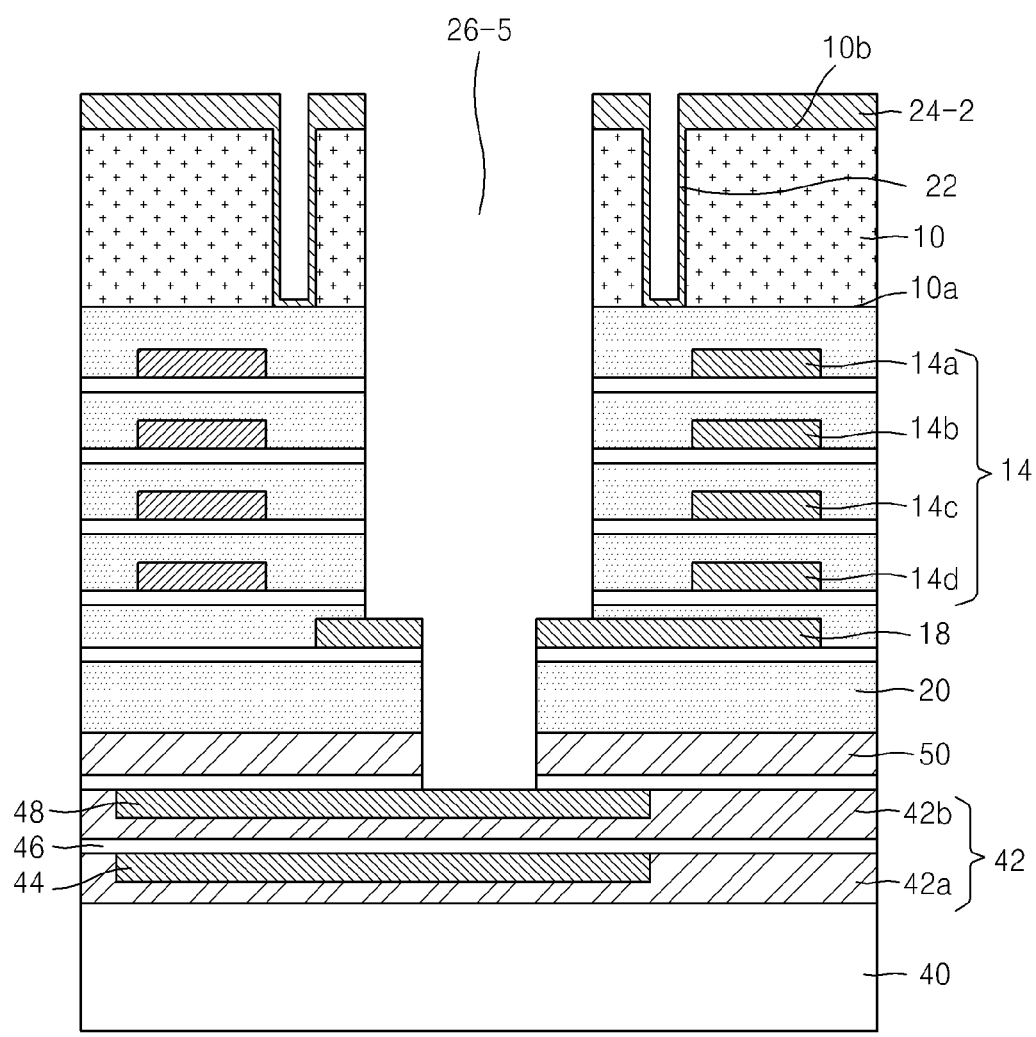
FIGS. 21 and 22 are cross-sectional views for describing a method of manufacturing a stack type image sensor according to exemplary embodiments of the inventive concept.
Figure 22:
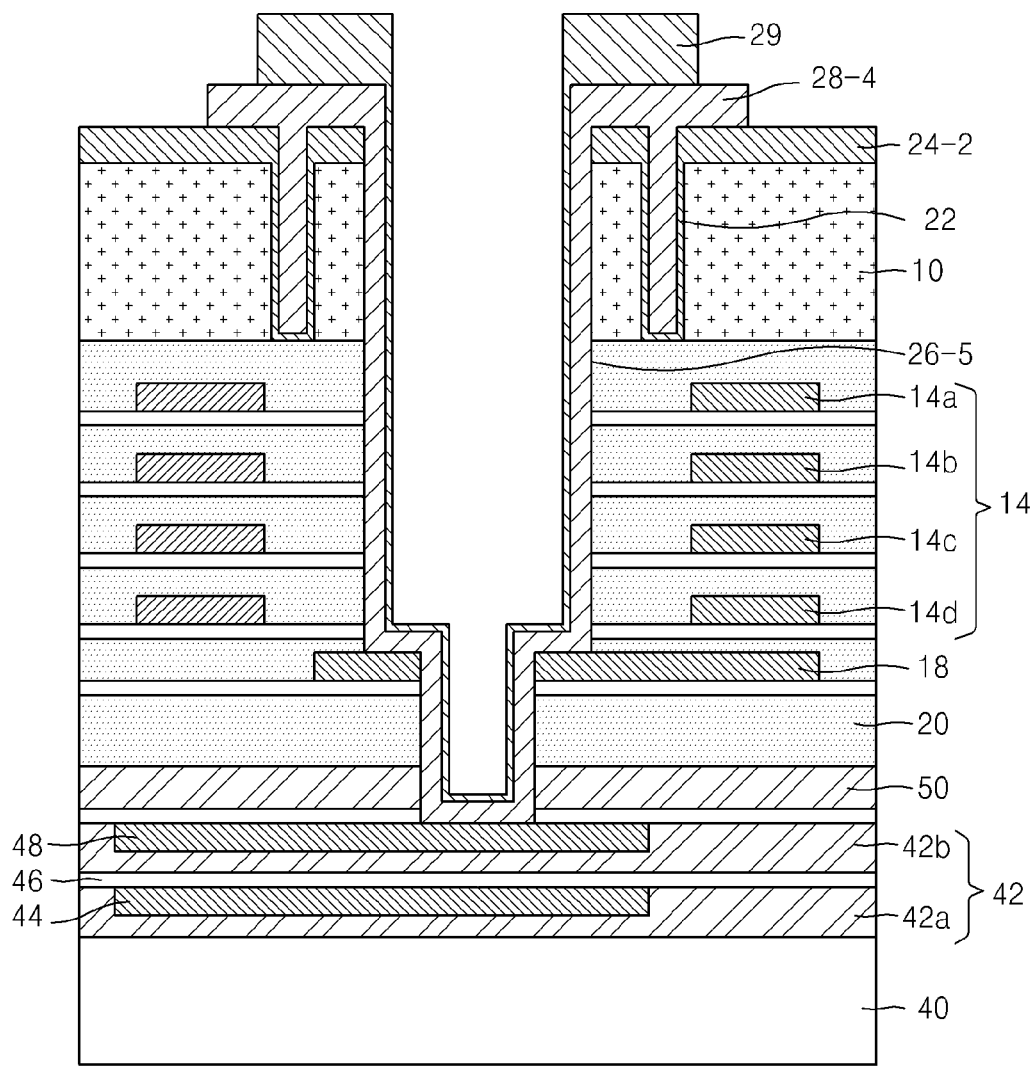

FIGS. 21 and 22 are cross-sectional views for describing a method of manufacturing a stack type image sensor according to exemplary embodiments of the inventive concept.

In detail, the method of manufacturing a stack type image sensor according to these example embodiments of the inventive concept may be substantially the same as the manufacturing method according to the previously-described embodiments of the inventive concept, except for a method of forming the via isolation layer 24-2 and the through via 28-4. FIGS. 21 and 22 are for describing a method of manufacturing the stack type image sensor of FIGS. 5 and 6.

As described above, step 201 to step 207 are performed. For example, the first junction insulation layer 20 on the first substrate 10 is joined to the second junction insulation layer 50 on the second substrate 40. Furthermore, the rear surface of the first substrate 10 is polished, and the via isolation trench 22 is formed at the first substrate 10.

As illustrated in FIG. 21, the via isolation layer 24-2 is formed on the inner wall of the via isolation trench 22 and the first surface 10b of the first substrate 10. The via isolation layer 24-2 is formed on the inner wall and bottom of the via isolation trench 22 and the one surface 10b of the first substrate 10. For example, the via isolation layer 24-2 may be formed so as not to completely fill the via isolation trench 22.

As illustrated in FIG. 21, the via trench 26-5 which exposes the first and second landing pads 18 and 48 is formed to pass through the first substrate 10, the first insulation layer 12, the first landing pad 18, the first junction insulation layer 20, and the second junction insulation layer 50.

As illustrated in FIG. 22, the through via 28-4 is buried in the via isolation trench 22 and disposed on the via isolation layer 24-2. The through via 28-4 electrically connects the first and second landing pads 18 and 48, and is formed on an inner wall of the via trench 26-5. For example, the via isolation trench 22 is buried, and simultaneously, the through via 28-4 is formed on the inner wall of the via trench 26-5, thereby simplifying a manufacturing process. Since the through via 28-4 does not completely fill the inside of the via trench 26-5, the first landing pad 18 is more easily connected to the second landing pad 48.

Furthermore, as illustrated in FIGS. 5 and 6, the metal layer 27, the protective layer 29, and the anti-moisture-absorption layer 31 are formed through burial, and thus, the through via 28-4 is reinforced or protected.

Application Example of Stack Type Image Sensor

Figure 23:
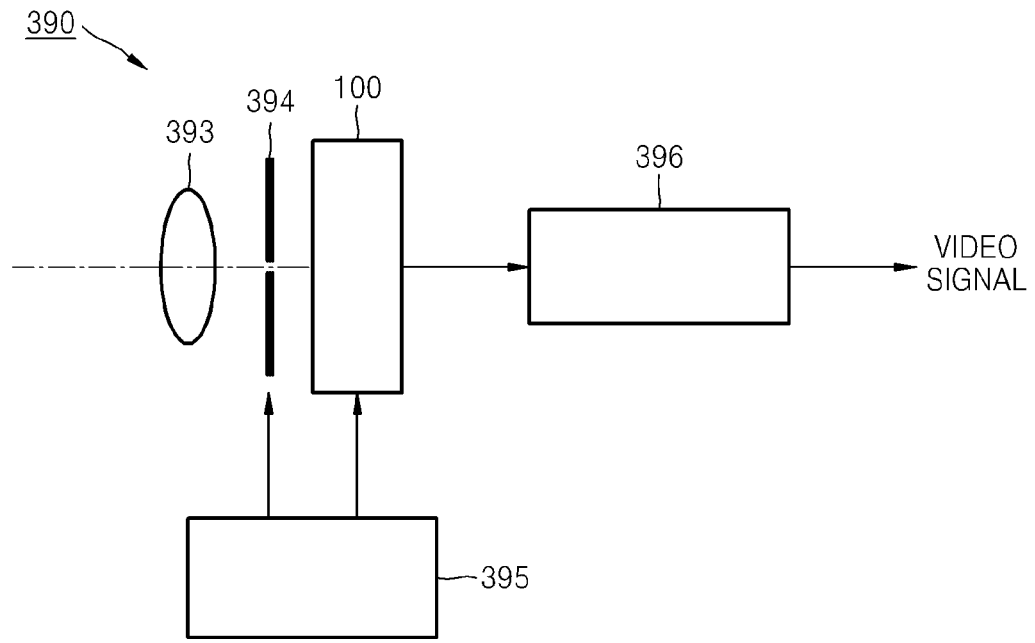
FIG. 23 is a block diagram of a camera using a stack image sensor according to certain embodiments of the inventive concept.

FIG. 23 is a block diagram of an exemplary camera 390 using a stack image sensor according to certain embodiments of the inventive concept.

In detail, the camera 390 includes a stack type image sensor 100, an optical system 393 that transmits incident light to a light-receiving sensing unit of the stack type image sensor 100, a shutter device 394, a driving circuit 395 that drives the stack type image sensor 100, and a signal processing circuit 396 that processes an output signal of the stack type image sensor 100.

The stack type image sensor 100 may be implemented, for example, as one of the stack type image sensors according to the above-disclosed embodiments of the inventive concept. The optical system including an optical lens irradiates an imaging surface of the stack type image sensor 100 with image light (i.e., incident light), which is input from a subject. Therefore, a signal charge is accumulated in the stack type image sensor 100 for a certain time.

The optical system 393 may be configured as an optical lens system including a plurality of optical lenses. The shutter device 394 controls a light irradiation period and a light blocking period for the stack type image sensor 100. The driving circuit 395 supplies a driving signal or a timing signal to the stack type image sensor 100 and the shutter device 394. Also, a signal output operation of the signal processing circuit 396 for the stack type image sensor 100 and a shutter operation of the shutter device 394 are controlled according to the supplied driving signal or timing signal.

The driving circuit 395 supplies the driving signal or the timing signal to control an operation of transmitting a signal from the stack type image sensor 100 to the signal processing circuit 396. The signal processing circuit 396 performs various types of signal processing on a signal transmitted from the stack type image sensor 100. An image signal for which signal processing has been performed is stored in a storage medium such as a memory, or is output to a monitor.

Figure 24:
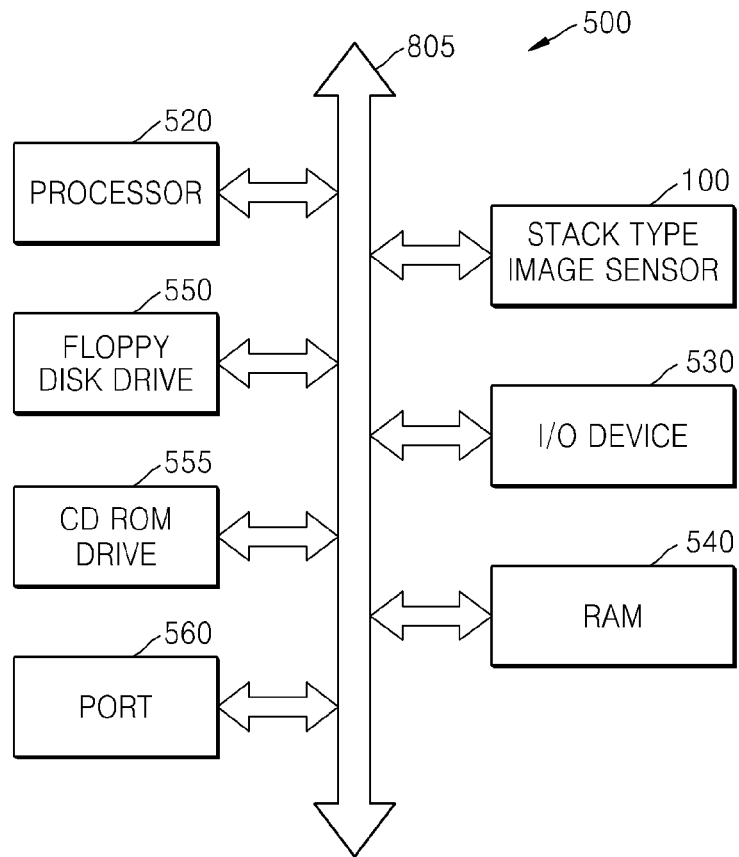
FIG. 24 is a block diagram of an imaging system including a stack image sensor according to certain embodiments of the inventive concept.

FIG. 24 is a block diagram of an exemplary imaging system 500 including a stack image sensor according to certain embodiments of the inventive concept.

In detail, the imaging system 500 is a system that processes an output image of the above-described stack type image sensor 100. The imaging system 500 may be any kind of electronic system equipped with the stack type image sensor 100, such as a computer system, a camera system, a scanner, a cellular phone or tablet device including a camera, an image stabilizing system, etc.

The processor-based imaging system 500 such as the computer system may include a processor 520 such as microprocessor or a central processing unit (CPU) which communicates with an input/output (I/O) device 530 through a bus 505. A floppy disk drive 550, a CD ROM drive 555, a port 560, and an RAM 540 may be connected to the processor 520 through the bus 505 to exchange data, and may reproduce an output image about data of the stack type image sensor 100.

The port 560 may be a port that is coupled to a video card, a sound card, a memory card, or a USB device, or via which data is exchanged with another system, for example. The stack type image sensor 100 may be integrated with processors such as a CPU, a digital signal processor (DSP), or a microprocessor, or may be integrated with a memory. Alternatively, the stack type image sensor 100 may be integrated as a chip separate from a processor. The imaging system 500 may be a system block diagram such as a camera phone or a digital camera among recently advanced digital devices.

While the present disclosure has been particularly shown and described with reference to exemplary embodiments thereof, it will be understood that various changes in form and details may be made therein without departing from the spirit and scope of the following claims.

What is claimed is:

1. A stack type image sensor comprising:
a first image sensor unit that comprises first through fourth via isolation trenches penetrating from a first surface of a first substrate to a second surface of the first substrate opposite to the first surface, a via isolation layer including an insulation material formed in each of the first through fourth via isolation trenches, a first landing pad insulated by a first insulation layer formed on the second surface of the first substrate, and a first junction insulation layer disposed on the first landing pad and the first insulation layer;
a second image sensor unit that comprises a second landing pad, which is insulated by a second insulation layer formed on a second substrate, and a second junction insulation layer which is disposed on the second landing pad and the second insulation layer and contacts the first junction insulation layer;
a first through via that is insulated from one or more circuits of the first substrate by the via isolation layer of the first and second via isolation trenches and electrically connects the first landing pad to the second landing pad; and
a second through via that is insulated from one or more circuits of the first substrate by the via isolation layer of the third and fourth via isolation trenches and electrically connects to the first landing pad or the second landing pad,
wherein each of the first and second through vias includes a first conductive layer, and
wherein each of the first through fourth via isolation trenches does not extend beyond the second surface of the first substrate.

2. The stack type image sensor of claim 1, wherein the via isolation layer is formed to pass through from the first surface to the second surface of the first substrate.

3. The stack type image sensor of claim 1, wherein:
the first image sensor unit further comprises one or more transistors isolated from each other by a first device isolation layer disposed on the second surface of the first substrate, the second image sensor unit further comprises one or more transistors isolated from each other by a second device isolation layer disposed on a first surface of the second substrate, and the via isolation layer is formed to pass through from the first surface of the first substrate to the first device isolation layer.

4. The stack type image sensor of claim 1, wherein the via isolation layer is formed on the first surface of the first substrate.

5. The stack type image sensor of claim 1, wherein the via isolation layer is formed on an inner wall of each of the via isolation trenches.

6. The stack type image sensor of claim 1, wherein the first image sensor unit includes a pixel circuit.

7. The stack type image sensor of claim 6, wherein the second image sensor unit includes a logic circuit driving the pixel circuit.

8. The stack type image sensor of claim 1, wherein the first through via is buried in a first via trench which passes through the first substrate, the first insulation layer, the first junction insulation layer, and the second junction insulation layer and exposes the first and second landing pads.

9. The stack type image sensor of claim 1, wherein the first through via is buried in a first via trench, which passes through the first substrate, the first insulation layer, the first junction insulation layer, and the second junction insulation layer and exposes the second landing pad, and wherein the second through via is buried in a second via trench which passes through the first substrate and the first insulation layer and exposes the first second landing pad.

10. The stack type image sensor of claim 1, wherein the first through via is buried in a first via trench, which passes through the first substrate, the first insulation layer, the first landing pad, the first junction insulation layer, and the second junction insulation layer and exposes the first and second landing pads.

11. The stack type image sensor of claim 1, wherein the first through via is formed on an inner wall of a first via trench, which passes through the first substrate, the first insulation layer, the first landing pad, the first junction insulation layer, and the second junction insulation layer and exposes the first and second landing pads.

12. The stack type image sensor of claim 1, further comprising:
a crack propagation stopper layer formed in the first substrate, the first insulation layer, the first junction insulation layer, the second junction insulation layer, the second insulation layer, and the second substrate to prevent crack propagation.

13. A stack type image sensor comprising:
a first image sensor unit that comprises first through fourth via isolation layers each including an insulation material which passes through from a first surface of a first substrate toward a second surface of the first substrate opposite to the first surface, a first insulation layer which is disposed on the first substrate and each of the first through fourth via isolation layers of the second surface of the first substrate, a first landing pad which is disposed in the first insulation layer, a first junction insulation layer which is disposed on the first landing pad and the first insulation layer, and a pixel circuit;
a second image sensor unit that comprises a second insulation layer which is disposed on a second substrate, a second landing pad which is disposed in the second insulation layer, a second junction insulation layer which is disposed on the second landing pad and the second insulation layer and contacts the first junction insulation layer, and a logic circuit;
a through via that is surrounded by the first and second via isolation layers and electrically connects the first landing pad to the second landing pad; and
an external connection through via that is surrounded by the third and fourth via isolation layers and is connected to the first landing pad or the second landing pad,
wherein each of the through via and the external connection through via includes a first conductive layer, and
wherein each of the first through fourth via isolation layers is not formed beyond the second surface of the first substrate.

14. The stack type image sensor of claim 13, wherein the external connection through via is buried in an external connection via trench which passes through the first substrate, the first insulation layer, the first junction insulation layer, and the second junction insulation layer and exposes an external connection second landing pad having a same level as a level of the second landing pad.

15. The stack type image sensor of claim 13, wherein the external connection through via is buried in an external connection via trench which passes through the first substrate and the first insulation layer and exposes an external connection first landing pad having a same level as a level of the first landing pad.

16. A semiconductor device comprising:
a first chip including a first via isolation trench penetrating a first substrate, a first via isolation layer including an insulation material in the first via isolation trench, a first conductive layer on the first substrate, and a first insulation layer;
a second chip including a second conductive layer on a second substrate, and a second insulation layer contacting the first insulation layer;
a first via trench penetrating the first substrate to expose the second conductive layer with respect to the first via trench; and
a first through via formed in the first via trench, and including a third conductive layer insulated from the first substrate by the first via isolation layer, the third conductive layer electrically connecting the first conductive layer to the second conductive layer,
wherein the third conductive layer is formed in the first via isolation trench, and
wherein the first via isolation trench does not extend beyond the first substrate.

17. The semiconductor device of claim 16, further comprising:
a second via isolation trench penetrating the first substrate;
a second via isolation layer including an insulation material in the second via isolation trench;
a second via trench penetrating the first substrate to expose the first conductive layer or the second conductive layer; and
a second through via formed in the second via trench, and including a fourth conductive layer insulated from the first substrate by the second via isolation layer, the fourth conductive layer electrically connecting the first conductive layer or the second conductive layer.

18. The semiconductor device of claim 17, wherein the first through via further includes a fifth conductive layer formed on the third conductive layer and on an inner wall of the first via trench.

19. The semiconductor device of claim 16, wherein the first through via further includes an anti-moisture-absorption layer formed on the third conductive layer.

20. The semiconductor device of claim 16, wherein the first chip includes an array of pixels, the second chip includes a processing circuit for the first chip, and the first through via provides a signal transmission path between pixels of the first chip to processing circuitry of the second chip.

* * * * *